(12) United States Patent
Avery et al.

(10) Patent No.: US 7,534,142 B2
(45) Date of Patent: May 19, 2009

(54) DIFFERENTIAL SIGNAL CONNECTOR WITH WAFER-STYLE CONSTRUCTION

(75) Inventors: Hazelton P. Avery, Batavia, IL (US); Patrick R. Casher, North Aurora, IL (US); Richard A. Nelson, Geneva, IL (US); Kent E. Regnier, Lombard, IL (US)

(73) Assignee: Molex Incorporated, Lisle, IL (US)

( * ) Notice: Subject to any disclaimer, the term of this patent is extended or adjusted under 35 U.S.C. 154(b) by 0 days.

(21) Appl. No.: 12/231,946

(22) Filed: Sep. 8, 2008

(65) Prior Publication Data

US 2009/0011620 A1 Jan. 8, 2009

Related U.S. Application Data

(62) Division of application No. 11/359,739, filed on Feb. 22, 2006, now Pat. No. 7,422,483.

(60) Provisional application No. 60/655,051, filed on Feb. 22, 2005.

(51) Int. Cl.
*H01R 13/648* (2006.01)
(52) U.S. Cl. .......................... 439/608; 439/65
(58) Field of Classification Search ............... 439/608, 439/65
See application file for complete search history.

(56) References Cited

U.S. PATENT DOCUMENTS

| | | | |
|---|---|---|---|
| 3,871,728 A | 3/1975 | Goodman | |
| 5,157,477 A | 10/1992 | Chance | |
| 5,417,578 A | 5/1995 | Mroczkowski et al. | |
| 5,522,727 A | 6/1996 | Saito et al. | |
| 5,664,968 A * | 9/1997 | Mickievicz | 439/608 |
| 5,757,252 A | 5/1998 | Cho et al. | |
| 6,350,134 B1 | 2/2002 | Fogg et al. | |
| 6,384,341 B1 | 5/2002 | Rothermel et al. | |
| 6,388,208 B1 | 5/2002 | Kiani et al. | |
| 6,433,286 B1 | 8/2002 | Doberenz | |
| 6,528,737 B1 | 3/2003 | Kwong et al. | |
| 6,534,854 B1 | 3/2003 | Fazelpour et al. | |
| 6,607,402 B2 | 8/2003 | Cohen et al. | |
| 6,717,398 B2 | 4/2004 | Cartier | |
| 6,764,349 B2 * | 7/2004 | Provencher et al. | 439/608 |
| 6,767,252 B2 | 7/2004 | McGrath et al. | |
| 6,814,619 B1 * | 11/2004 | Stokoe et al. | 439/608 |
| 6,843,657 B2 | 1/2005 | Driscoll et al. | |
| 6,848,917 B2 | 2/2005 | Lang et al. | |
| 6,875,031 B1 * | 4/2005 | Korsunsky et al. | 439/608 |
| 2002/0168898 A1 * | 11/2002 | Billman et al. | 439/608 |
| 2002/0179332 A1 | 12/2002 | Uematsu et al. | |

(Continued)

FOREIGN PATENT DOCUMENTS

EP 1 311 038 5/2003

OTHER PUBLICATIONS

International Search Report for PCT/US06/006110.

(Continued)

*Primary Examiner*—Briggitte R Hammond

(57) ABSTRACT

Stacked receptacles in a connector that each provide side-by-side differential signal contacts, are attached to a circuit board without additional width to accommodate multiple layers of differential signals by using connector wafer inserts that rotate the side-by-side positioned differential signal contacts to front-to-back contacts.

10 Claims, 17 Drawing Sheets

U.S. PATENT DOCUMENTS

| | | |
|---|---|---|
| 2004/0039859 A1 | 2/2004 | He et al. |
| 2004/0150970 A1 | 8/2004 | Lee |
| 2004/0224559 A1 | 11/2004 | Nelson et al. |
| 2005/0011676 A1 | 1/2005 | Barr et al. |
| 2005/0151597 A1 | 7/2005 | Brunker et al. |
| 2005/0151604 A1 | 7/2005 | Brunker |
| 2005/0156690 A1 | 7/2005 | Brunker et al. |
| 2005/0168303 A1 | 8/2005 | Brunker et al. |
| 2005/0174191 A1 | 8/2005 | Brunker et al. |
| 2005/0201065 A1 | 9/2005 | Regnier et al. |
| 2005/0202722 A1 | 9/2005 | Regnier et al. |
| 2006/0003628 A1 | 1/2006 | Long et al. |
| 2006/0091545 A1 | 5/2006 | Casher et al. |
| 2006/0139117 A1 | 6/2006 | Brunker et al. |
| 2006/0189212 A1 | 8/2006 | Avery et al. |
| 2008/0009147 A1 | 1/2008 | Avery et al. |

OTHER PUBLICATIONS

European Search Report for EP 06735673.

* cited by examiner

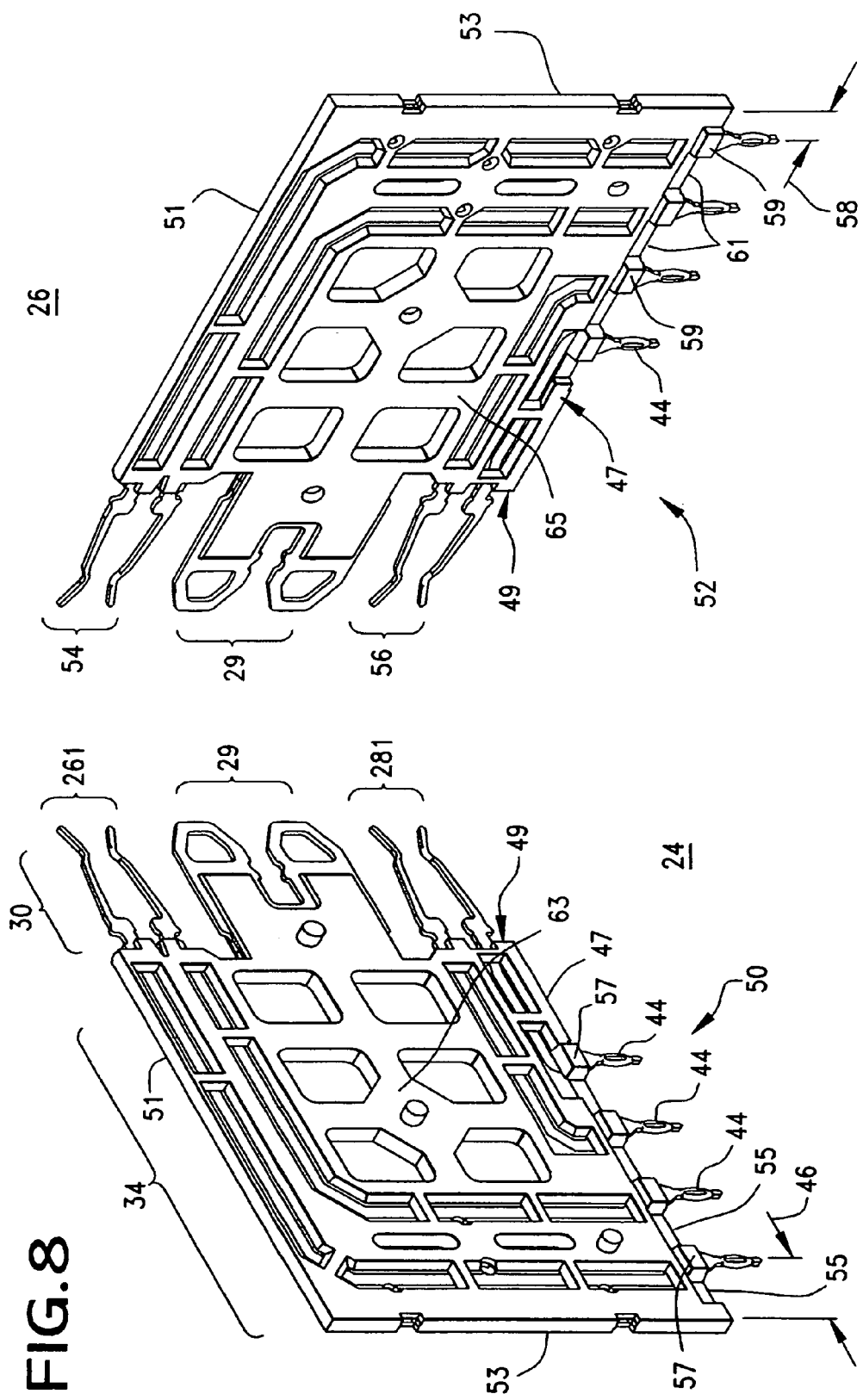

US 7,534,142 B2

DIFFERENTIAL SIGNAL CONNECTOR WITH WAFER-STYLE CONSTRUCTION

REFERENCE TO RELATED APPLICATIONS

This application claims priority from U.S. Provisional Patent Application No. 60/655,051, filed Feb. 22, 2005.

BACKGROUND OF THE INVENTION

This invention relates generally to high speed connectors that are used as vertically stacked receptacle connectors, and more particularly, to connectors utilizing insert wafers that incorporate differential signal terminals which are positioned alongside each other where they appear in the connector receptacle portions and which are turned at their tail portions for joining to a printed circuit board.

Electrical connectors are well known to those of ordinary skill in the electronic arts as generally reliable devices by which electrical signal paths can be extended into and obtained from a printed circuit board. Over the last several years, however, electronic devices and systems have gotten both smaller and faster, making reliable connectors more difficult to design, manufacture and install onto printed circuit boards.

In a connector used in high-speed applications, crosstalk that is likely to occur between closely spaced, high-speed signal paths can be reduced by using differential-voltage signals. A differential signal pair is a pair of terminals or other conductors that together carry a signal but neither of the two conductors is at ground or reference potential. Rather, the voltage on one conductor of a differential pair is, at any given instant, the same magnitude, but opposite polarity as the voltage on the other conductor. A differential pair therefore is analogous to a transmission line, the conductors of which are capacitively and inductively coupled to each other. Crosstalk between two or more differential signal pairs as well as interference of one differential pair on another can be significantly reduced if a good ground plane (or other fixed-voltage reference plane) is provided between the conductors of one differential pair and the conductors of another differential pair as a sort of shield between them.

Each differential signal pair requires at least two capacitively coupled conductors, and it is important for a connector that links a differential signal pair between devices or circuit boards to maintain capacitive coupling. When a connector is used to provide an edge connection for a circuit board or is used as a plug connector, arranging differential signal pairs in a connector so that they are alongside each other and next to each other on the same side of a circuit board can cause the connector width to increase, but when the connector is installed onto a circuit board, connector width should be minimized.

SUMMARY OF THE INVENTION

It is therefore a general object of the present invention to provide a circuit board connector which provides one or more receptacle connector, each of which will accept the edge connector of a circuit board or like device.

Another object of the present invention is to provide a stacked receptacle connector, each receptacle of which will accommodate differential signal pairs.

Yet another object of the present invention is to provide a stacked receptacle connector that enables differential signal pairs to be installed into a connector body using individual inserts in the form of wafers, each of which is relatively easy to manufacture and each of which also allows ground planes to be provided between each wafer insert in an encompassing connector housing.

Another object of the present invention is to provide a connector for use in high speed applications, the connector including an insulative housing with a hollow interior cavity, the cavity accommodating a plurality of terminal signal and ground terminal inserts in the form of thin wafers, each wafer supporting a plurality of conductive terminals, the terminals having contact portions, tail portions and body portions interconnecting the contact and tail portions together, the signal terminals being disposed so that most of the terminals are oriented with their wider sides arranged vertically for broadside capacitive coupling to adjacent corresponding terminals in adjacent wafers, and a small part of the signal terminal body and tail portions being bent and offset about 90 degrees so that the signal terminals are arranged in an edge-to-edge arrangement at the terminal tail portions.

Still another object of the present invention is to provide a connector for use with high speed differential signal applications in which terminals are held in assemblies that preferably take the form of insulative wafers, two wafers with conductive signal terminal being assembled together to form a signal terminal wafer assembly and two wafers that contain conductive ground terminals being arranged on opposite sides of the signal terminal assembly to provide reference ground terminal arrangements that flank the signal terminal assembly, the signal terminals having contact portion that are arranged in side-by-side order and termination portions that are arranged in edge-to-edge order.

A still further object of the present invention is to provide a unique circuit board layout for accommodating the tail portions of connectors of the structure described above, which circuit board layout facilities the high speed operation of connectors of the invention.

Yet another object of the present invention is to provide a circuit board with a particular arrangement of traces that enhance the high speed transmission abilities of the connectors of the invention, the circuit board having a plurality of conductive traces extending to mounting through holes disposed in a circuit board, the through holes being arranged in a pattern such that a plurality of ground traces encompass a pair of differential signal traces, and in which the ground traces are arranged at the corners of a four-sided figure, with the differential signal through holes arranged in line within a perimeter defined by the ground through holes.

These and other objects of the present invention are accomplished by way of the structure of the invention. A connector is provided with an insulative housing that has two or more receptacle portions, each of which is capable of accepting a card edge of other similar blade portion of an opposing electronic device, such as an electronic or opto-electronic module. The receptacle connectors of the invention include a plurality of pairs of differential signal terminals, and the terminals have a unique structure which permits them be broadside coupled in pairs along one extent of the connector, and subsequently edge coupled along a remaining extent of the connector.

Multiple inserts are provided which carry terminal that are intended to be designated as carrying differential signals. In this regard, multiple differential signal terminal pairs are supported in an insulative wafer that may be inserted into the connector housing. The signal terminal insert is preferably formed from two interengaging halves, and the terminals of each differential signal pair are spaced apart from each other in a parallel fashion. This is carried on from the terminal contact portions rearwardly in the terminal body portions to a location near the tail portions of the terminals.

The differential signal terminals conductors have their paths rotated in their supporting insert wafer so that they turn about 90 degrees near where the terminal body portions end and this turn extends into the terminal tail portions. Thus, the signal terminals are arranged in a line and are spaced apart along that line in an edge-to-edge arrangement. In this fashion, the terminals may engage in edge coupling along their tail portions and broadside coupling along their contact and body portions.

The halves of the signal terminal wafer inserts have serrated-style bases on which are formed alternating projections and recesses, with the projections of the first of the two insert wafer halves being received within the recesses of the second of the two signal insert wafer halves and vice-versa. In this manner the terminal tails portions are easily arranged in a line in the edge-to-edge fashion stated above.

Additional insert wafers are provided and are arranged in spaces provided between the signal terminal assemblies and these act as ground planes between adjoining signal terminal insert wafers to isolate signals carried through the signal wafers. The heights of the signal and ground terminal insert wafers are different so as to polarize the insert wafers and the connector housing so that ground terminal insert wafers cannot be inserted into a portion of the connector housing that is dedicated to receive a ground terminal insert wafer. Likewise, the connector housing is formed with different wafer-receiving slots, so that a ground wafer slot is capable of receiving only a ground terminal wafer and a signal terminal slot is capable of receiving only a signal terminal wafer assembly.

These and other objects, features and advantages of the present invention will be clearly understood through a consideration of the following detailed description

BRIEF DESCRIPTION OF THE DRAWINGS

In the course of this description, references will be made to the drawings, in which:

FIG. 8 is a perspective view of two sets of signal terminals with insulative body portions molded thereover, and facing in opposition to each other for subsequent assembly;

DETAILED DESCRIPTION OF THE PREFERRED EMBODIMENTS

Figure 1:
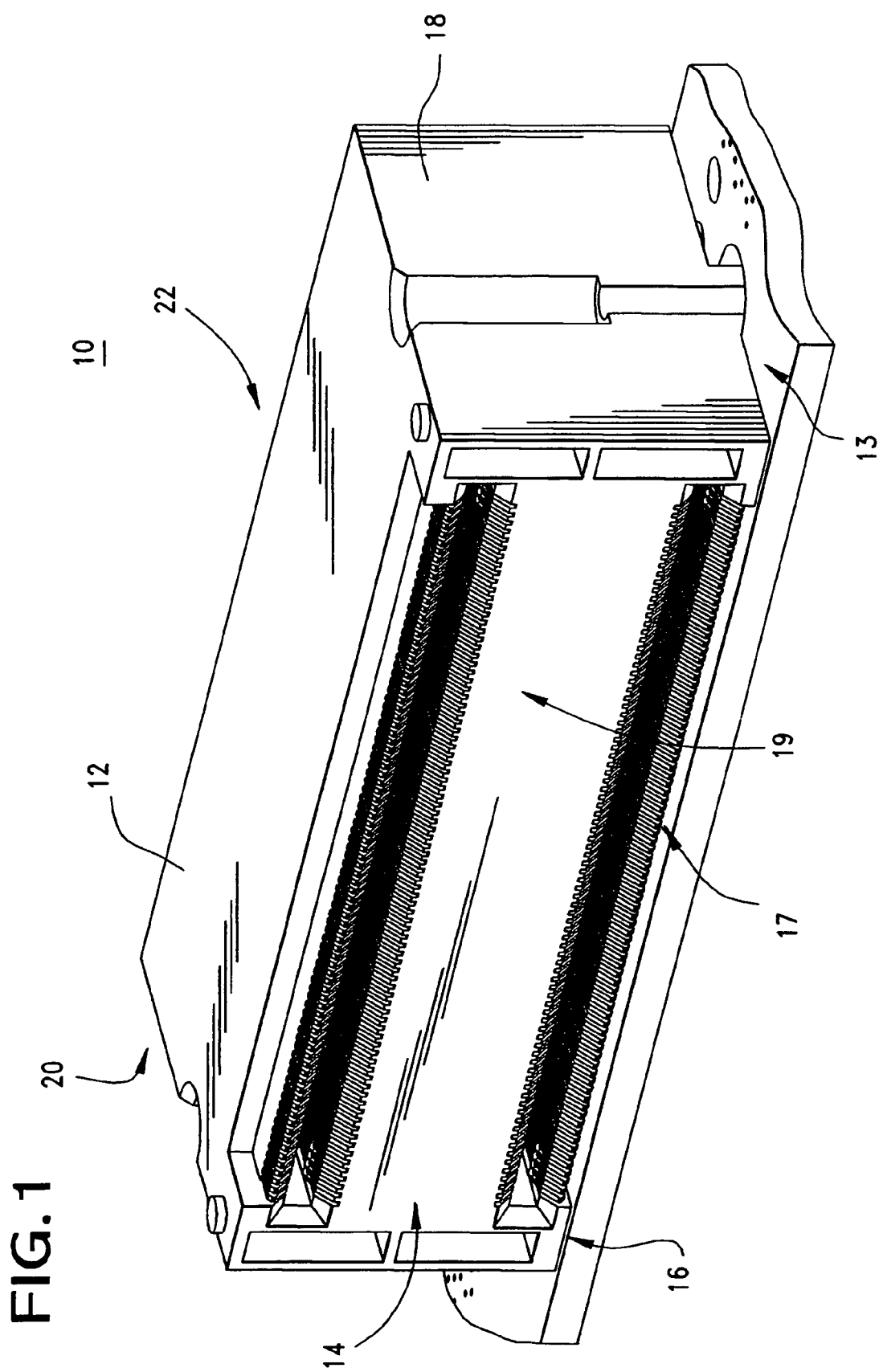
FIG. 1 is a perspective view of a connector that is constructed in accordance with the principles of the present invention.

Referring now to FIG. 1, there is shown a perspective view of a connector 10 that is constructed in accordance with the principles of the present invention. The connector 10 has a top surface 12, a front face 14, a bottom surface 16 and left and right side surfaces, or faces, 18 and 20. As can be seen in FIG. 1, the connector 10 front face has two receptacle portions 17 and 19 disposed thereon into which a circuit board, device or blade connector may be inserted and by which electrical signals can be carried to or extended from a circuit board 13 to which the base connector 10 is attached. The connector 10 of the present invention is a compressible attachment-style connector, meaning that it is attached to a circuit board by means of through hole pins, that as explained below, are shown in the embodiment depicted as compliant pins.

Figure 2:
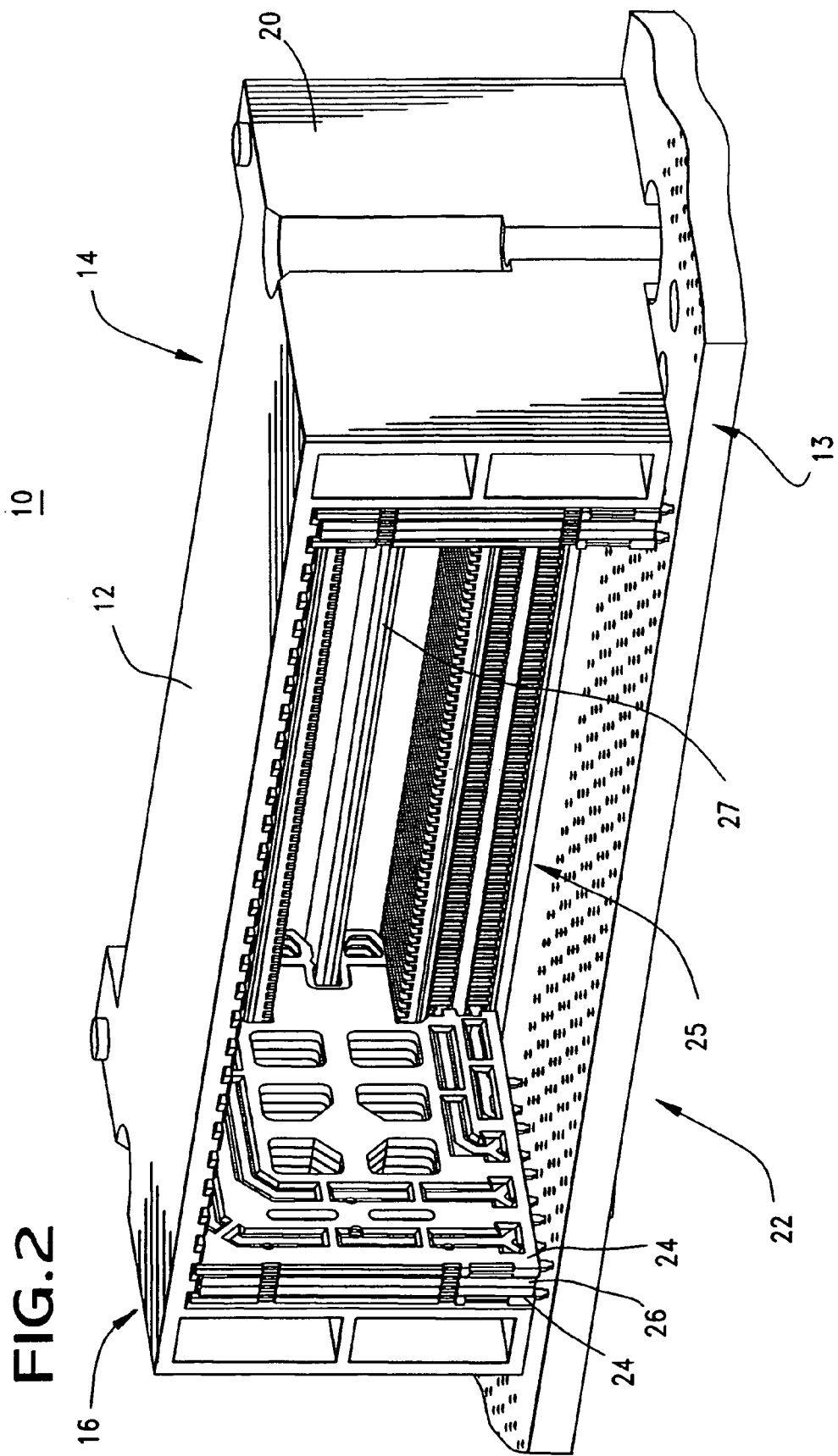
FIG. 2 is a perspective view of the connector of FIG. 1, taken from the rear thereof, with all but three insert wafers removed from the interior of the connector for clarity.

The connector also has a rear face 20, which is shown more clearly in FIG. 2, which is a perspective view of the connector 10 of FIG. 1, but taken from the rear thereof and looking into at the rear face 22 of the connector and into the hollow interior cavity 25 of the connector 10. At the left-hand side of the rear face 22 of the connector housing, there are shown three separate insert wafers, two of which are identified by reference numeral 24, the other of which is identified by reference numeral 26. As described more fully below, the insert wafers are of two types: a ground insert wafer 24 and a signal insert wafer 26 and the type is based upon the type of signals that are carried by the conductive terminals in each of the insert wafers. A signal insert wafer is intended to carry multiple signal signals, and particularly, pairs of differential signals. A ground insert wafer is intended to be connected to one or more ground planes on the circuit board and its terminals will carry ground signals as opposed to differential signals.

In the preferred embodiment of the connector 10 illustrated, each signal insert wafer 26 is installed between two ground insert wafers 24 as shown in FIG. 2. In this manner, the differential signal terminals of each pair may be maintained and directed within the insert wafer 26, but they are flanked by ground terminals that provide close ground paths that somewhat surround the signal pairs. This structure assists in providing maximum shielding of the signal insert wafer 26 and results in a reduction of EMI and signal cross talk and skew with or by other signal insert wafers that are present in the connector 10.

Figure 3:
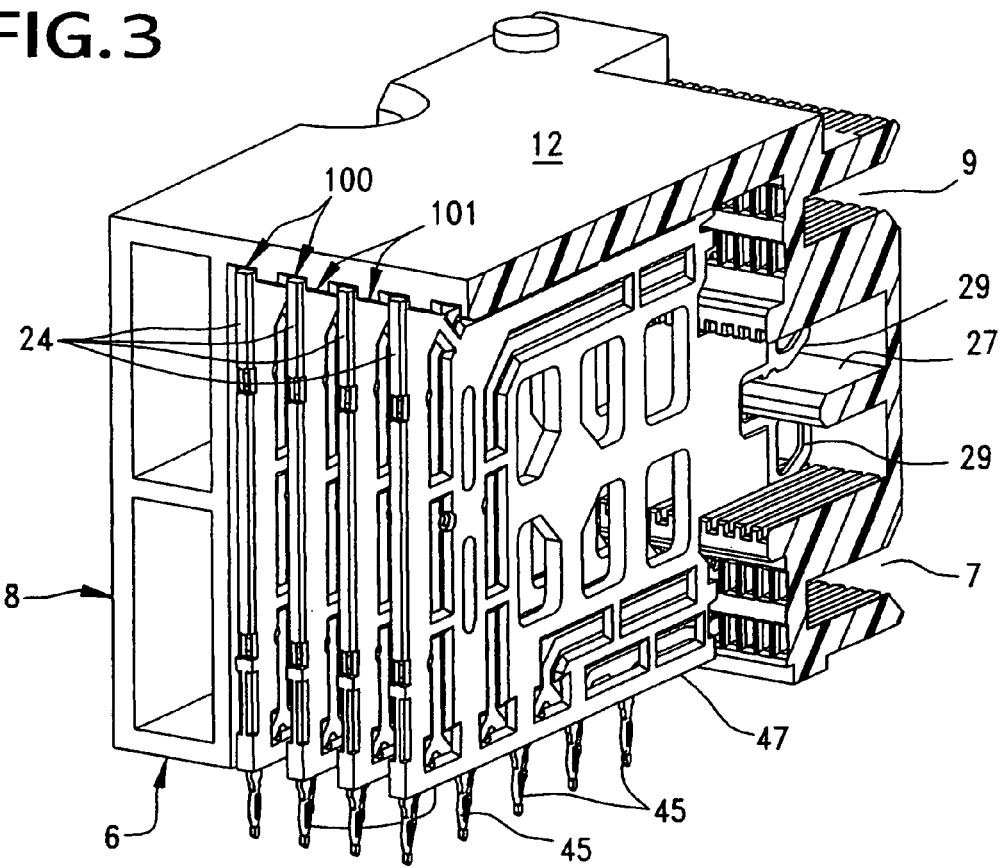
FIG. 3 is a sectional view of the connector of FIG. 1, taken from the rear and illustrating four ground terminal insert wafers in place within the interior of the connector housing.
Figure 4:
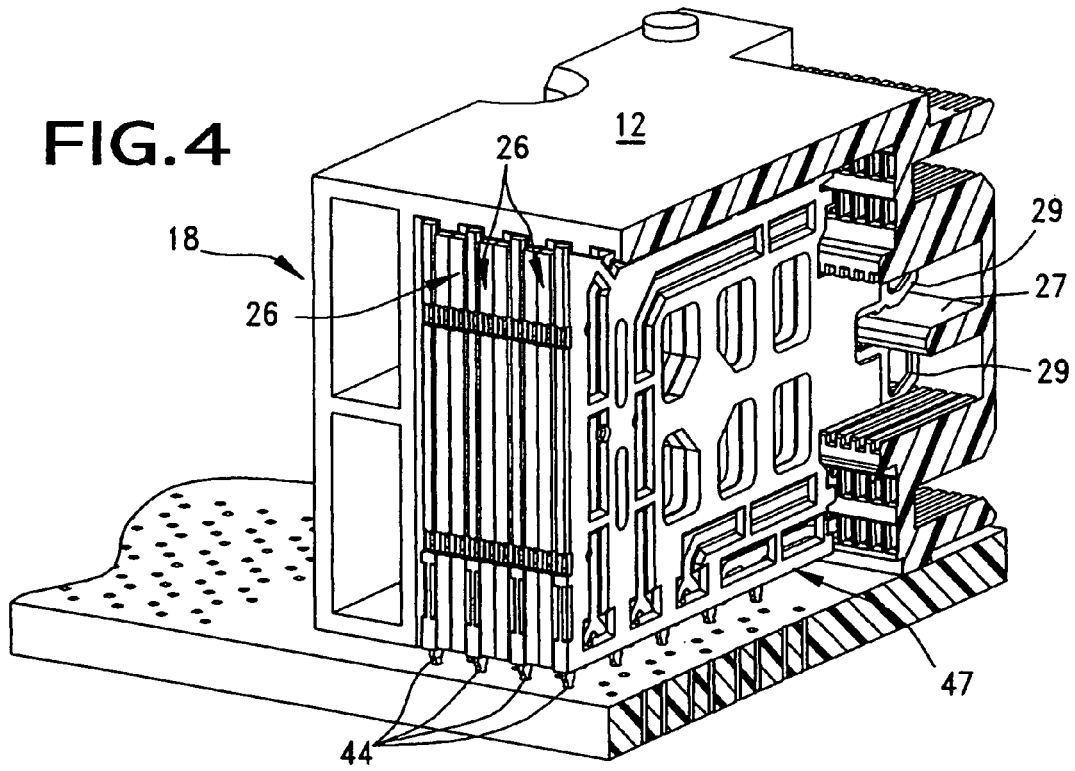
FIG. 4 is the same sectional view as FIG. 3, but illustrating three signal terminal insert wafers in place within the interior of the connector housing.

FIG. 3 is a sectional view of the connector 10 of FIG. 1, taken from the rear 22 of the connector 10 and illustrating four ground terminal insert wafers 24 installed within the interior of the connector housing and three signal-receiving slots interposed between the ground terminal insert wafers. FIG. 4, illustrates the same view with the signal terminal insert wafers 26 inserted in place. As can be seen in FIG. 3, each of the ground insert wafers 24 have compliant signal tail pins 45 that project from the bottom edge 47 of each ground insert wafer 24 and are co-linear along a longitudinal axis of the signal insert wafer. FIG. 4 is the same view of the rear face 22 of connector 10 as shown in FIG. 3, but with three signal wafer inserts 26 installed into the connector 10. Like the ground wafer inserts 24, the signal insert wafers 26 also have compliant pin tails 44 that project from the bottom edge 47 of each signal insert wafer 24 along the same line and are also co-linear.

Figure 5:
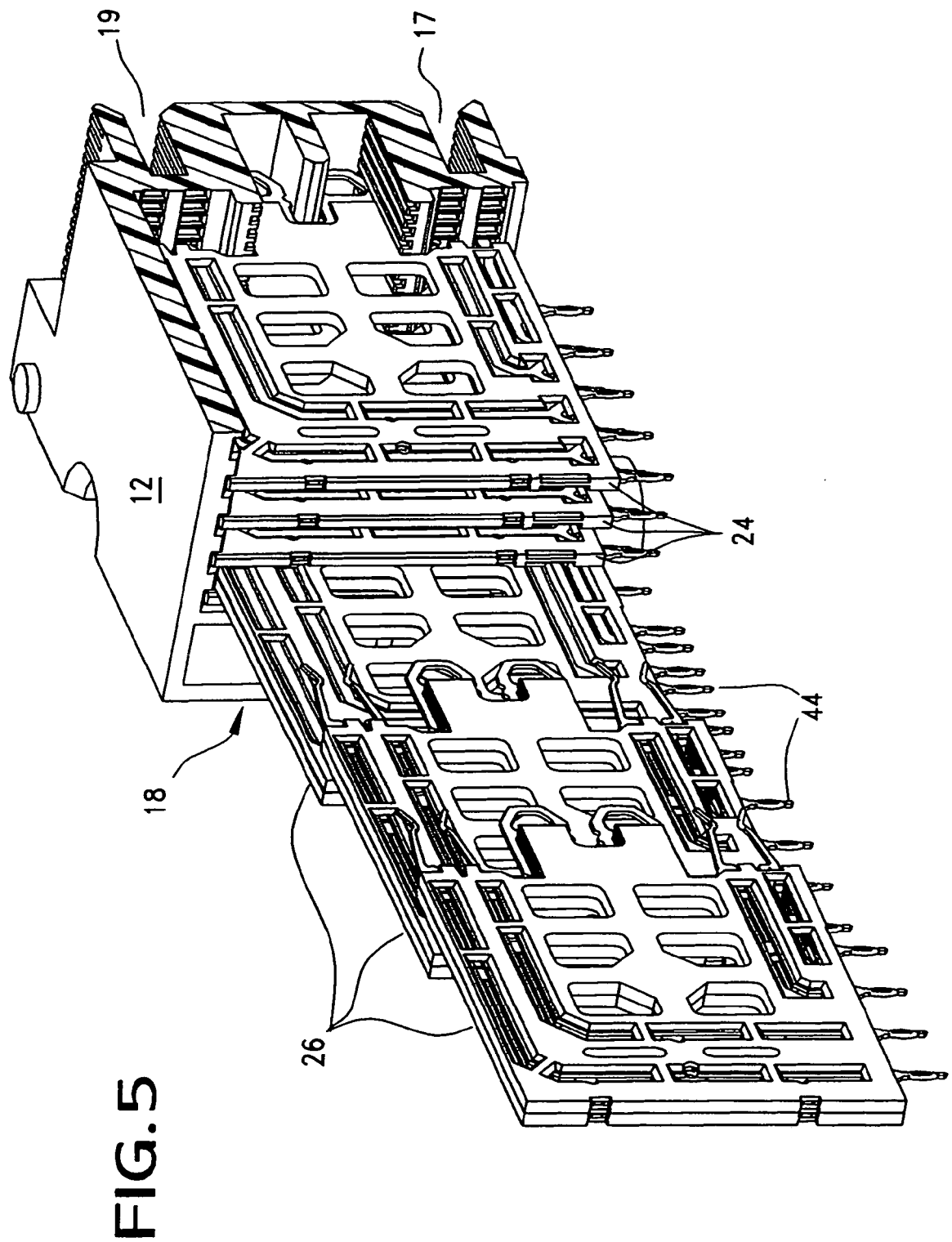
FIG. 5 is the same view as FIG. 4, but illustrating one of the three signal terminal inserts partially in place in the connector housing between two adjoining ground terminal wafer inserts and illustrating two signal terminal insert wafers aligned with their respective openings in the connector housing.

FIG. 5 is the same view as FIG. 4, but it illustrates one of the three signal terminal insert wafers 26 partially in place in the connector 10 between two adjoining (or flanking) ground terminal insert wafers 24. The signal insert wafers 26 and the ground insert wafers 24 have different heights so that they can be easily matched into their corresponding proper positions within the interior cavity 25 of the connector housing 10. By making the signal wafer inserts 26 of one height and the ground insert wafers 24 a different height, and making the signal insert wafer slot and ground insert wafer slots of the connector 10 to be of similar corresponding heights, the possibility of incorrectly installing a ground insert wafer 24 (taller) into a signal insert wafer slot or of installing a signal terminal insert wafer into a position that is designated for a ground terminal insert wafer is eliminated. This speeds up assembly and repair of the connectors of the invention. The ground terminal insert wafers are fit into slots 100 (FIG. 3) that are formed along at least one surface of the interior cavity 25 of the connector housing 10, while the signal terminal insert wafers fit against the intervening land portions 101 that are arranged between the slots 100. The heights of the signal and ground insert wafers may reversed, if desired, that is the signal insert wafers can be made taller than the ground insert wafers and the housing modified to accommodate this arrangement.

Figure 6:
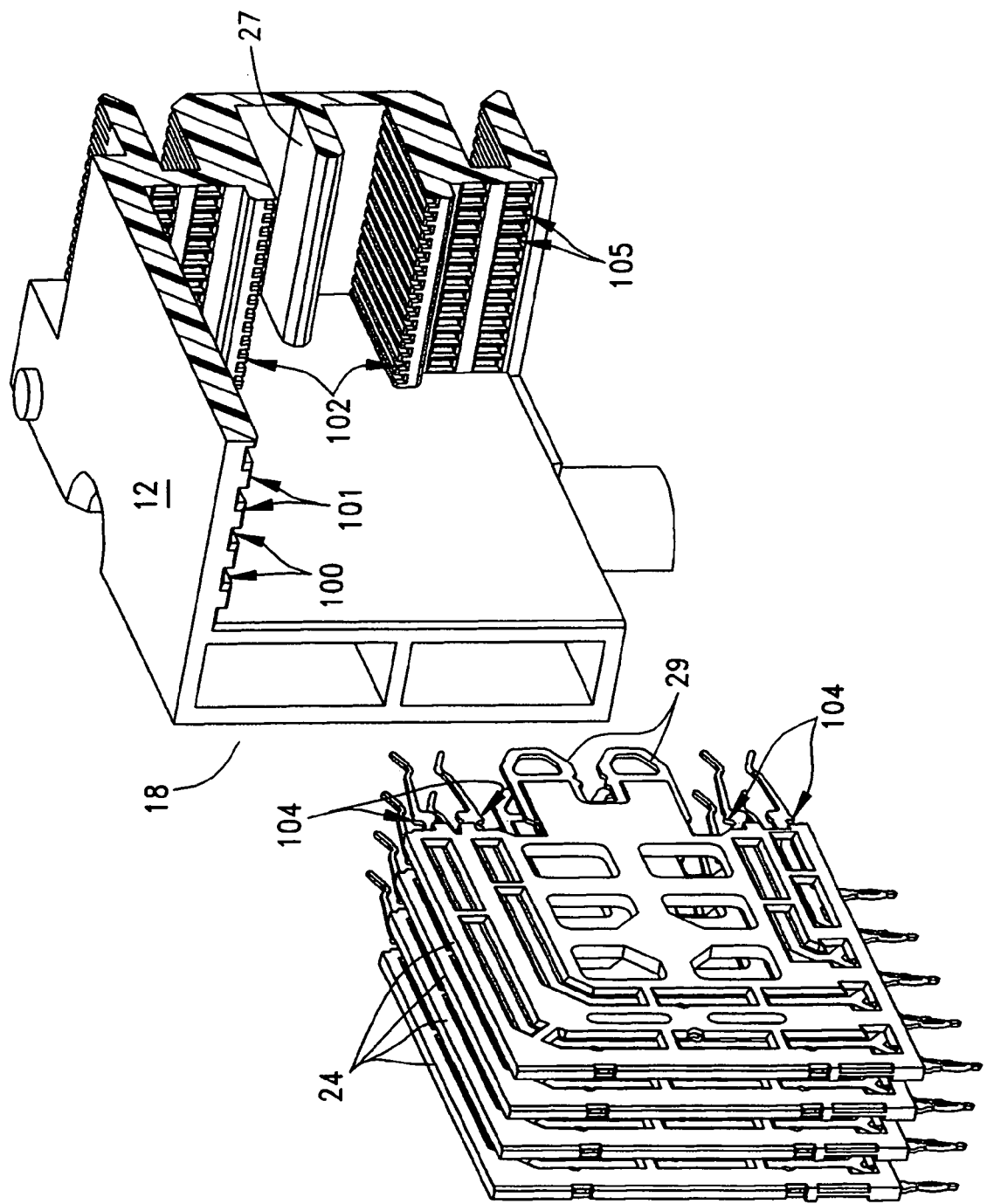
FIG. 6 is the same view as FIG. 3, with the ground terminal insert wafers removed to illustrate the interior of the connector housing.

FIG. 6 is the same view as FIG. 3, with the ground terminal insert wafers 24 removed for clarity in order to illustrate the interior cavity 25 of the connector 10 housing and clearly showing a insert wafer retention and alignment rib 27 that is formed as part of the connector 10 housing and which runs horizontally between the stacked receptacles 17 and 19 (FIG. 1) into which a circuit board, device or connector can be inserted. This rib 27 is sized and structured so that the retention clip 29 that is formed as part of each insert wafer 24 and 26 engages the alignment rib 27 and holds the insert wafers 24 and 26 in the connector 10 as plug connectors (not shown) are inserted into and removed from the connector housing 10. Additionally, the connector housing 10, may, on opposite sides of the alignment rib 27, include a plurality of secondary slots 102, each of which receives edges of the retention clips 29 of the signal and the ground insert wafers 24, 26. The terminals, as explained below, may include retention barbs 104 that engage the inner surfaces of terminal-receiving cavities 105 of the connector housing 10.

Figure 10A:
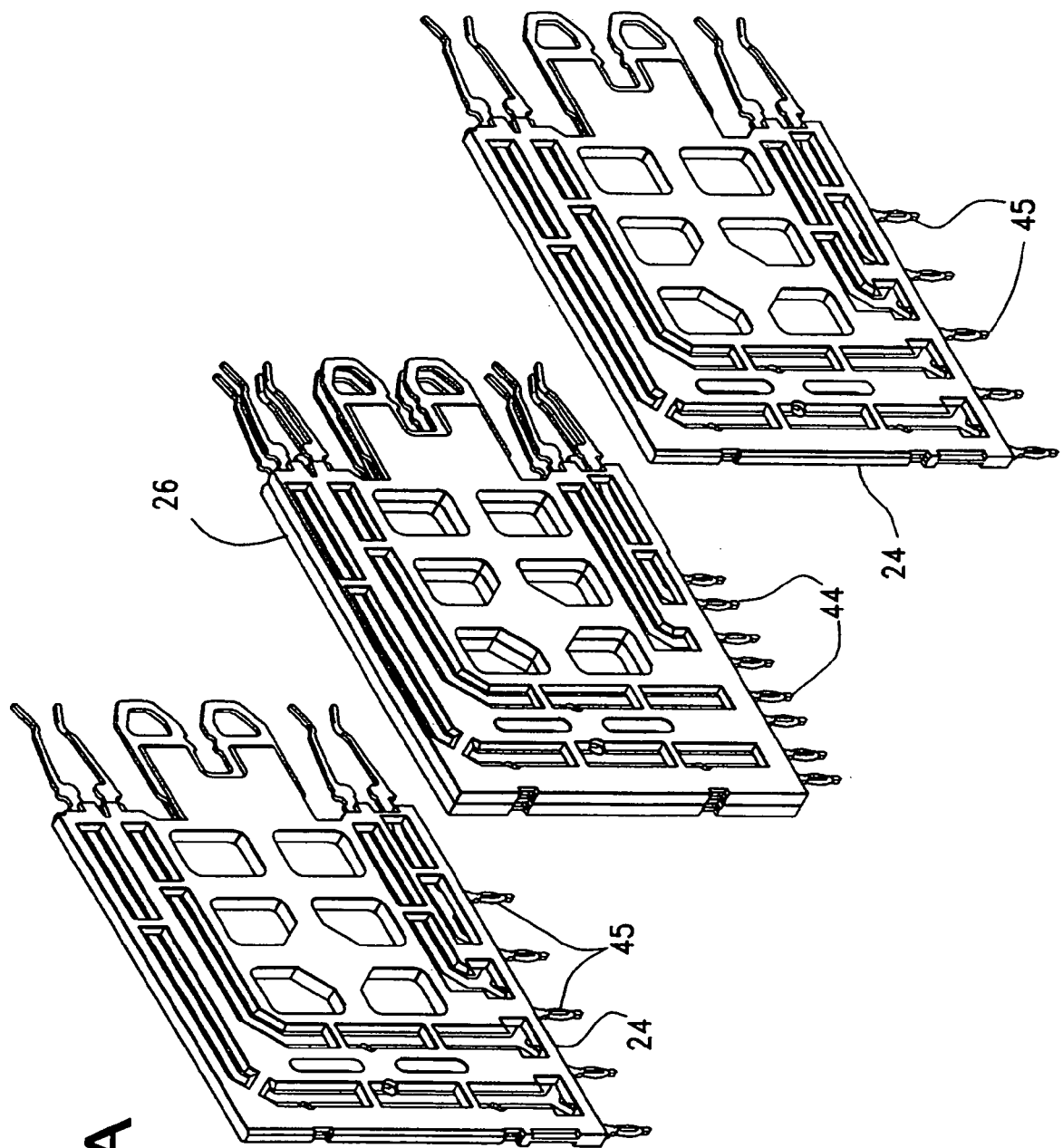
FIG. 10A is a perspective view of the signal terminal wafer insert of FIG. 9 flanked by two ground terminal insert wafers.
Figure 10B:
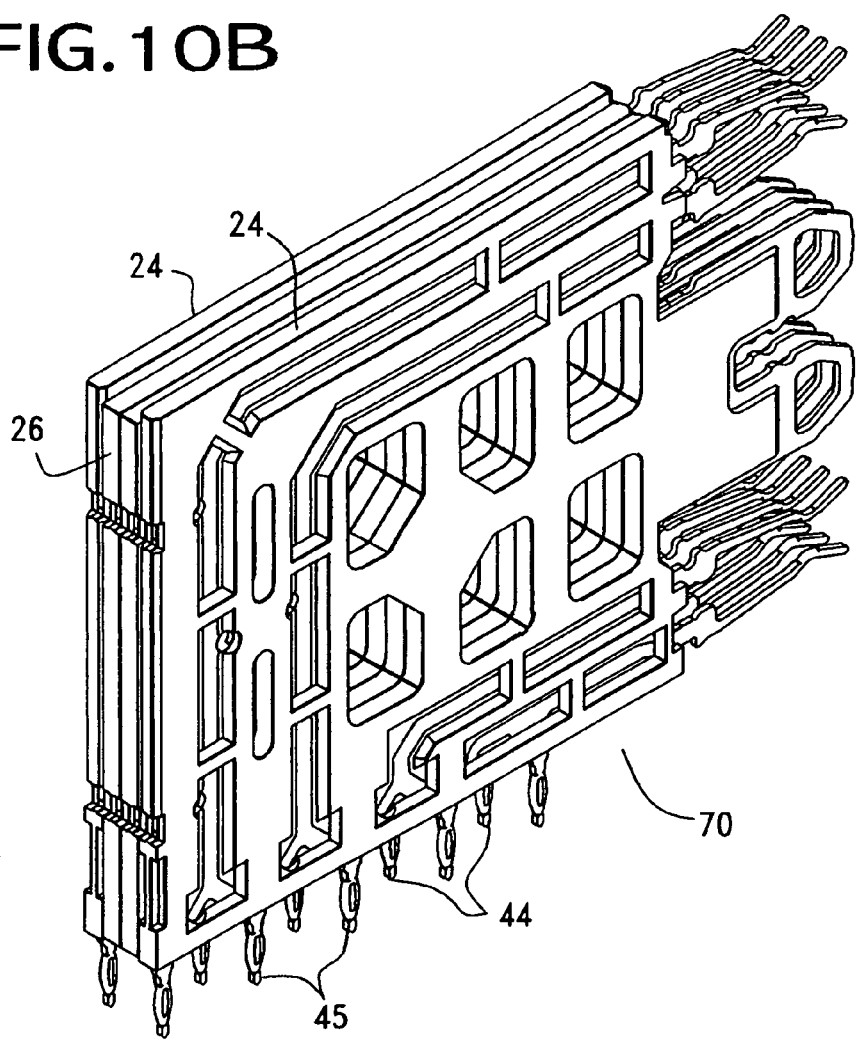
FIG. 10B is a perspective of all of the three (ground-signal-ground) insert wafers of FIG. 10B assembled together to form a single signal transmission unit.
Figure 10C:
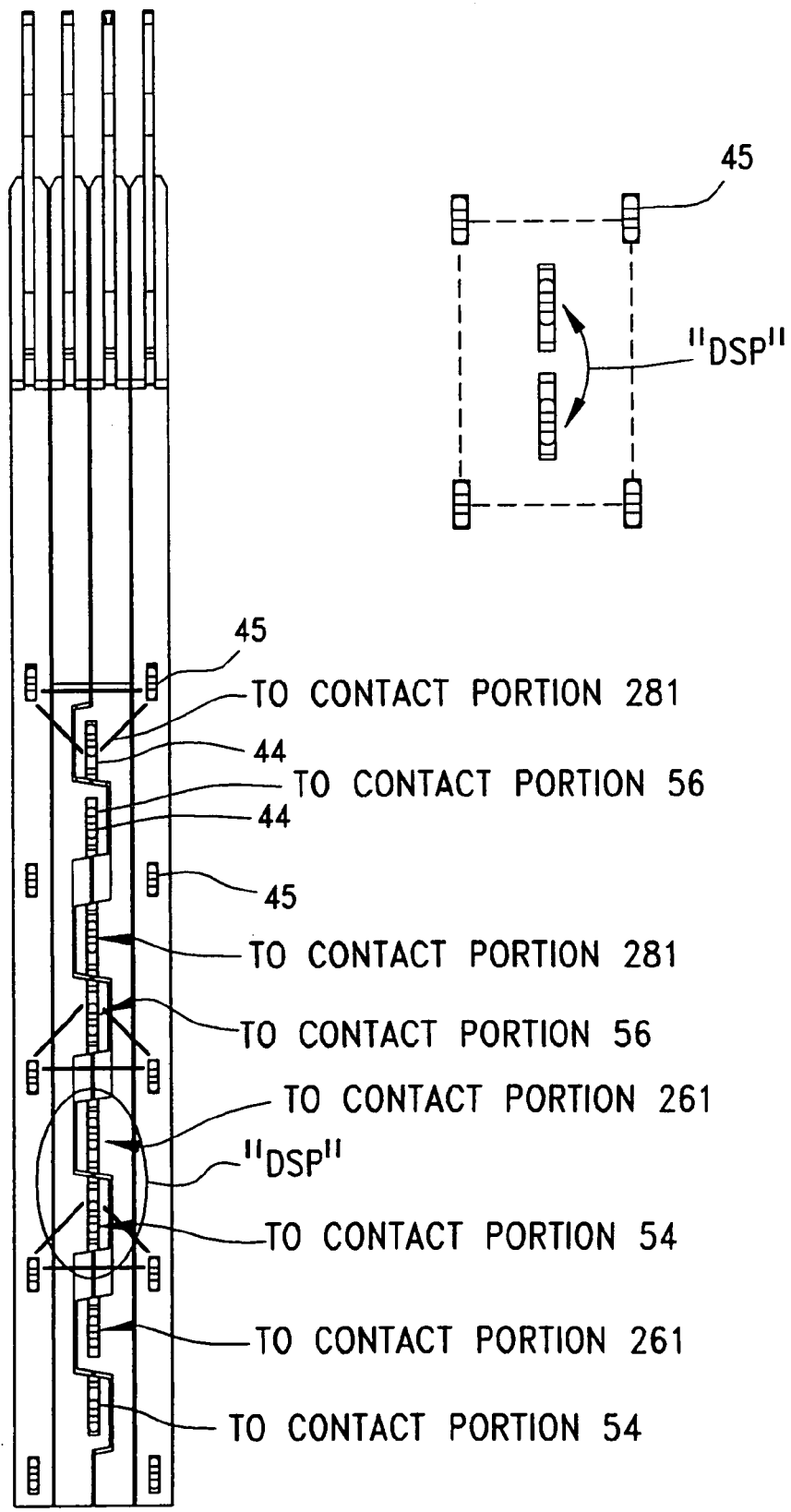
FIG. 10C is a bottom plan view of the single signal terminal wafer insert of FIG. 10A illustrating the orientation and layout of the tail portions of the terminals of the signal and ground terminal insert wafers.
Figure 14:
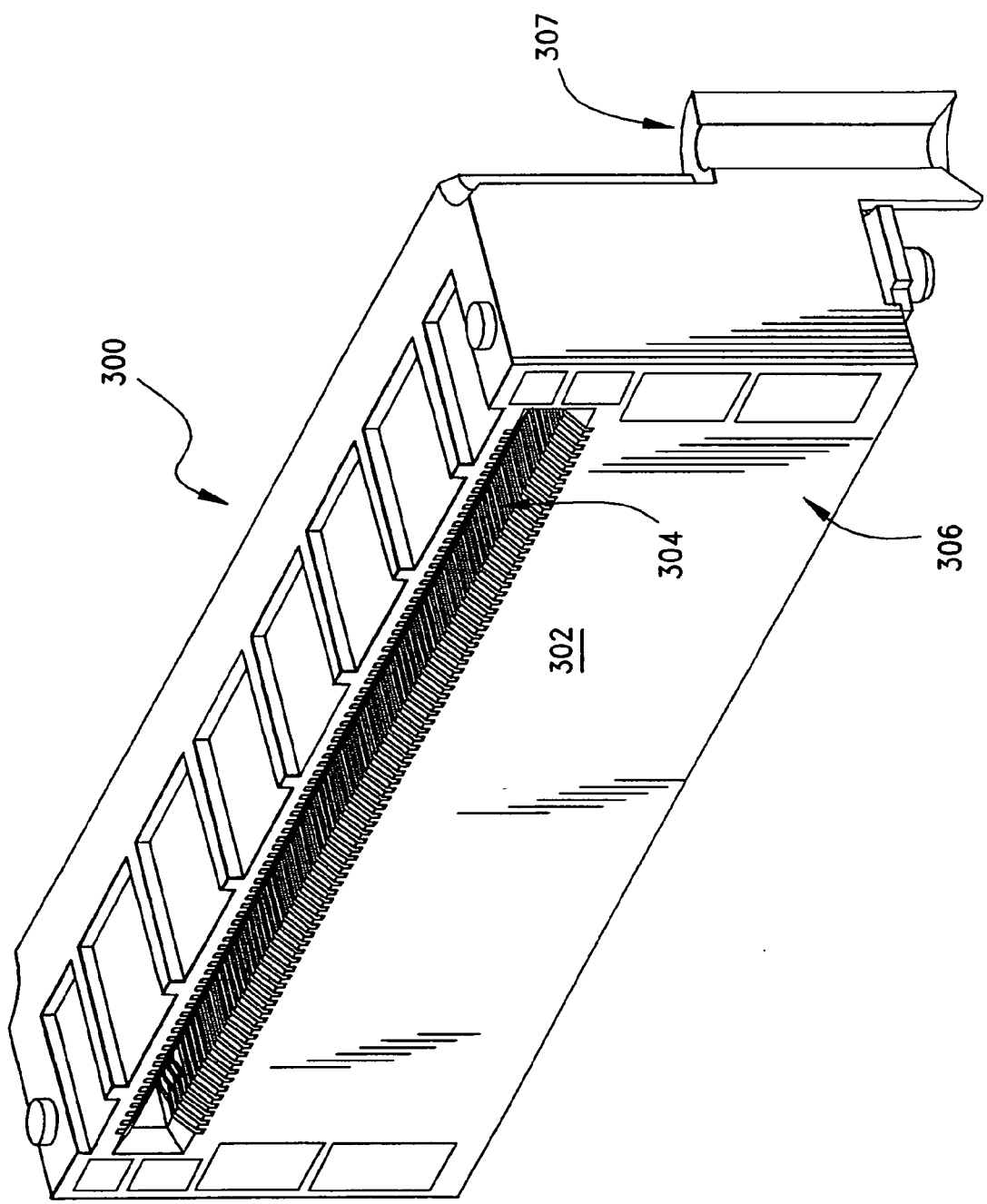
FIG. 14 is a perspective view of an alternate embodiment of a connector constructed in accordance with the principles of the present invention, but having only a single card-receiving, or mating slot for mating with an opposing connector.

As set forth above, the use of differential signals on a circuit board or other device requires two conductors to carry one differential signal with each conductor carrying an equal but opposite polarity signal as its mate. When the stacked receptacles 17 and 19 are both used to provide differential signal connectors, the pairs of side-by-side differential signal conductors in each receptacle 17 and 19 need to be connected to a mating contact on a circuit board 13 to which the connector 10 is attached. Therefore, in order to accommodate the attachment of many differential signal pairs from the top receptacle 19 and those required of the bottom receptacle 17 in the width of the connector 10, the differential signal pairs provided to each receptacle 17 and 19 needs to be "rotated" or somehow made offset so that the differential signal connections from the connector 10 to the circuit board 13 are aligned "front-to-back" or "edge-to-edge" as shown in FIG. 10C, where the connector 10 meets a circuit board 13 instead of "side-to-side" where a circuit board would be inserted into one of the receptacles 17 and 19 and the terminals contact an opposing element, such as a circuit card edge.

Figure 7:
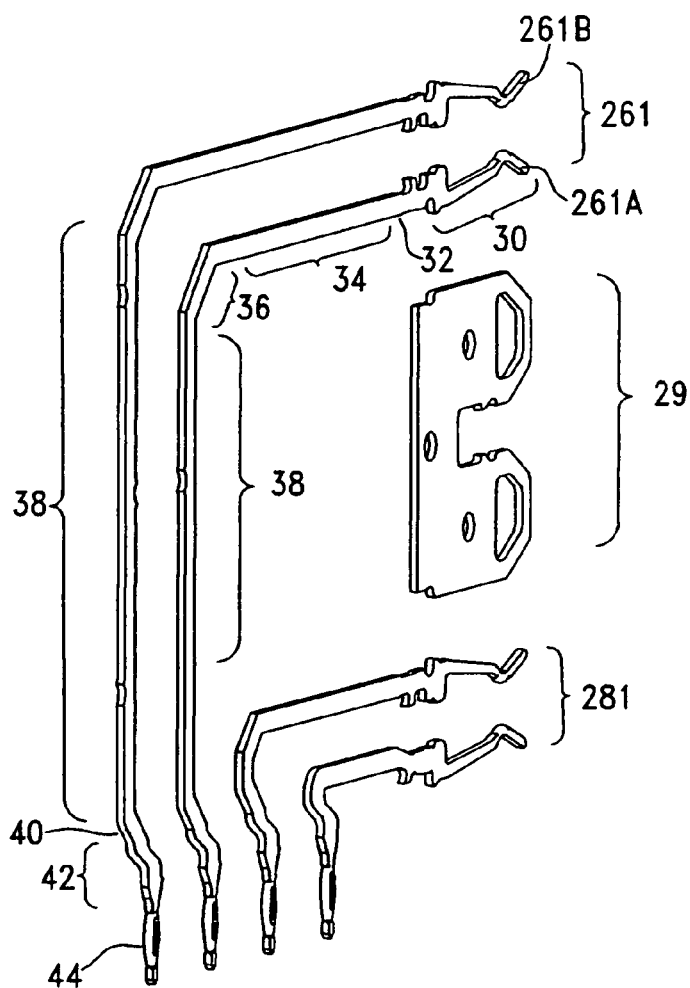
FIG. 7 is a perspective view of a set of terminals used in a signal terminal insert wafer used in the connector of FIG. 1.

FIG. 7 is a perspective view of a set of signal terminals 261, 281 that are used in a signal terminal insert wafer 24 of the connectors of the present invention. FIG. 7 also shows the relative position of the aforementioned retention clip 29. Because the sets of signal terminals 261 and 281 are identical except for their relative sizes, for brevity, only the top set of signal terminals 261 is described hereinafter. The signal terminal set 261 and 281 is comprised of a top or outside conductor 261A and a lower or inside conductor 261B. In one embodiment, conductive terminals 261A, 261B can be configured to be a differential signal pair. However, as is seen best in FIG. 8, terminal 261A is one terminal of one differential signal pair and terminal 261B is one terminal of a second and distinct differential signal pair. These terminals have corresponding differential signal terminals 54 which cooperatively define the differential signal terminal pair.

Still referring to FIG. 7, it can be seen that the terminals 261A and 261B each have a first, or contact, portion 30 which are mirror images of each other. Together, they form a contact beam pair that will slide over the edge of a plug connector mating blade (typically a circuit card) when it is inserted into one of the receptacles 17 and 19. With respect to terminal 261A, it includes a horizontal portion 34 that extends forward from a first point 32 away from an edge of the insulative wafer half into which it is molded. As can be seen in FIG. 8, the first point 32 is actually just beyond the front edge 49 of the first wafer half into which the terminals 261 and 281 are installed. The terminal 261A horizontal portion 34 extends "inwardly" to a second point 36 where the terminal 261A turns downwardly toward the bottom edge 47 of the signal insert wafer 26. The vertical portion 38 extends downwardly to a third point 40 whereat the terminal is formed into an "offset" 42 that travels inwardly as shown (toward the viewer in FIG. 7)

in order to ensure that the tail portions are aligned along a line of action at the bottom of the signal terminal insert wafer. The compliant pin tails 44 extend from the bottom of the offset 42 and can be inserted into a circuit board through hole.

Figure 7A:
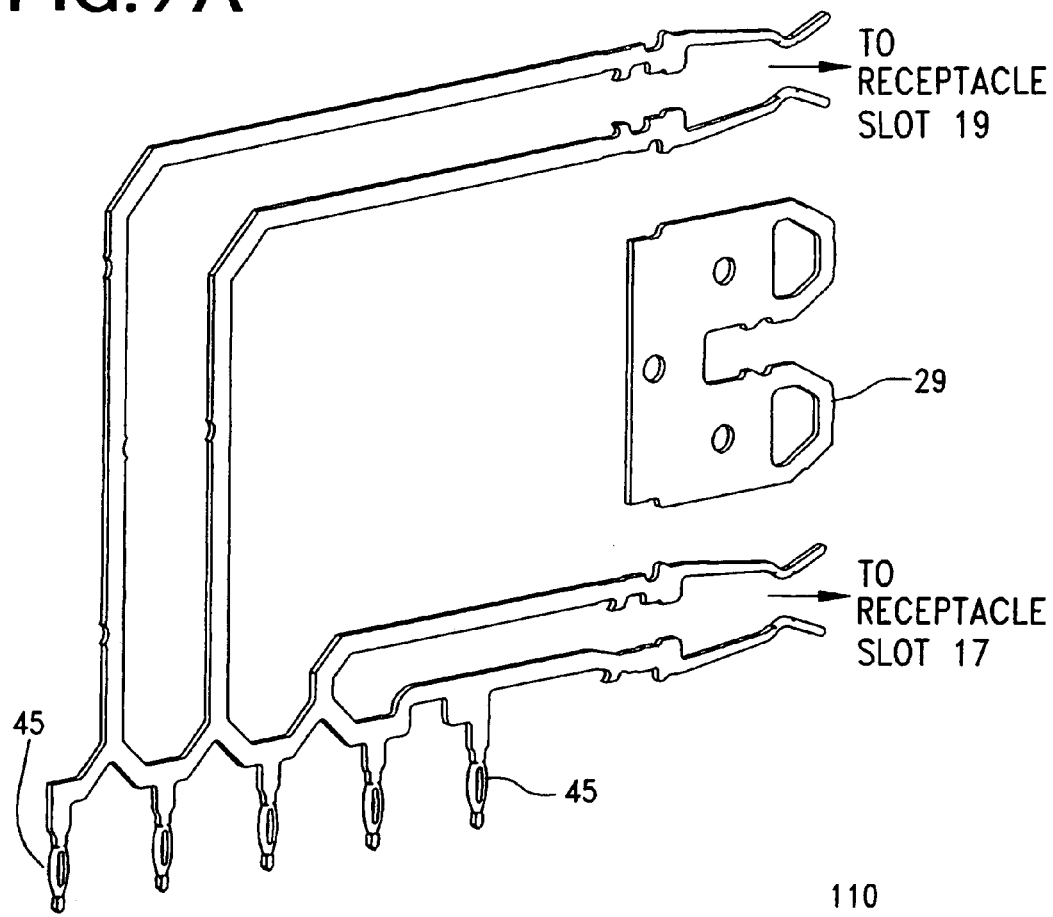
FIG. 7A is a perspective view of a set of terminals used in a ground terminal insert wafer used in the connector of FIG. 1.

FIG. 7A depicts a ground terminal for use in the aforementioned ground insert wafers. As can be seen, the ground terminal includes compliant tail pins 45 that are electrically and mechanically connected together as a single unit. The ground terminal set shown in FIG. 7A extend from the tail pins 45 to where it would exit receptacle slots 17 and 19. The ground terminal shown in FIG. 7A provides an isolating ground plane between signal wafer inserts installed into the connector 10.

FIG. 8 is a perspective view of the two halves that make up a signal wafer insert and in particular, a perspective view of two sets of signal terminals 261, 281 with the insulative body portions of the insert wafer molded over the terminals (shown in FIG. 7). As shown in the figure, the signal insert wafer 24 is comprised of a left half 50 and a right half 52. With respect now to just the left half 50, it can be seen that the terminals 26 and 28 have portions that extend beyond the front edge 49 of the wafer half to form the aforementioned clip and extend parallel to the bottom edge 47 and the top edge 51 toward the rear edge 53. Near the rear edge 53, the terminals turn downwardly toward the rear edge 47 and exit as the aforementioned compliant tails 44. The signal terminal tail portions of the two wafer halves extend toward each other near the tail portions so that they may arrive at the in-line tail arrangement that is present at the bottom of the signal insert wafer.

Just above the bottom edge 47 of the left half 50 of the signal insert wafer 24 there are a series of notches 55 and teeth 57 (or "valleys" and "peaks") that run most of the length of the bottom edge 47. In particular, however, a notch 55 is formed immediately in front of the rear edge 53 of the left half of the signal insert wafer. On the right half 52 of the signal wafer's 24 bottom edge 47, a tooth 59 is formed that is immediately in front of the rear edge 53 of the right half 52 such that the tooth 59 on the right-hand half 52 of the insert wafer 24 will engage the notch 55 that is immediately in front of the rear edge 53 of the left half 50. When the left and right halves 50 and 52 are joined together, the notches 55 and teeth 57 of the left half 52 engage the teeth 59 and notches 61 of the right half 52 in a sort of "sawtooth" engagement of each half to the other. This sawtooth, or serrated, arrangement permits the tail portions of the signal terminals to come out of plane and be aligned linearly along the bottom edge of the signal terminal insert wafer.

It can be seen in FIG. 8 that the signal insert wafer 24 includes a left half 50 and a right half 52. The left half 52 includes a relatively flat or planar insulative body 63 that is, of course, made of a non-conductive material. The right half 52 is also comprised of a relatively flat or planar insulative body 65 that is sized and shaped to mate with the left body 63. Both the spacer body 63 and the right body 65 have a "front" edge identified by reference numeral 49. Both bodies have a "bottom" edge 47 as well as a "top" edge 51. The rear edge 53 is considered to be "opposed" to the front edge 49; the top edge 51 is considered to be opposite the bottom edge 47.

Figure 9A:
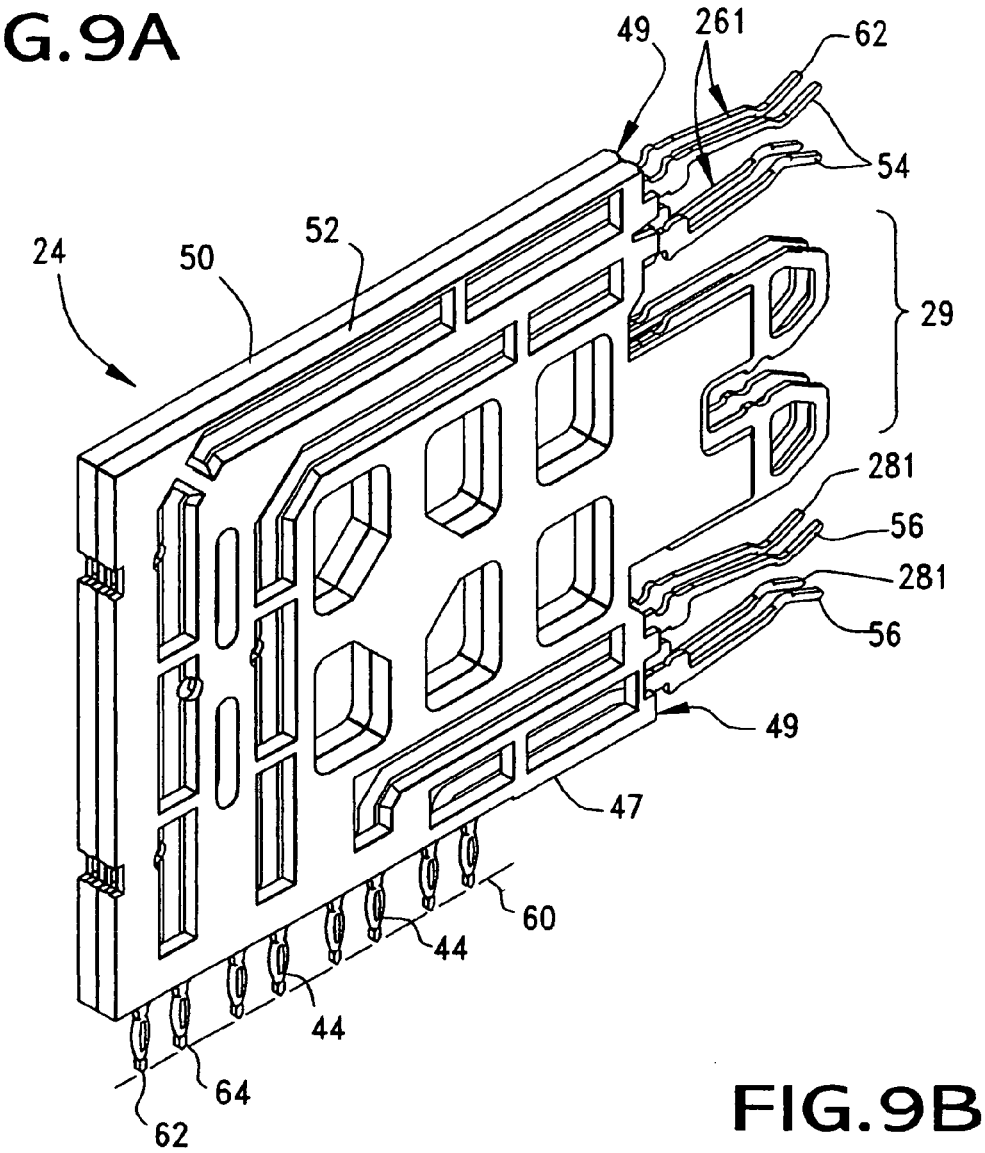
FIG. 9A is the same view as FIG. 8, but illustrating the two signal terminal insert wafer halves assembled together to form a single signal terminal insert wafer.

The terminals depicted in FIG. 7 run through each of the left half 50 and the right half 52 and are identical except for one small but very important aspect. FIG. 9A is the same view as FIG. 8, but illustrates the two signal terminal wafer insert halves 50 and 52 assembled together to form a single signal terminal insert wafer 24. As can be seen in FIG. 9A, the compliant pin tails 44 that extend downwardly from the bottom edge 47 are co-linear because they lie in the same plane (not shown). Stated alternatively, the side-by-side positions of differential terminals 62 and 54 at the front edge 49 of the signal insert wafer 24 become front-to-back positions 62 and 54 when these same terminals exit the signal insert wafer 24 from its bottom edge 47. The re-arrangement of the differential terminals is enabled by different and opposing offsets 42 in the left and right halves 50 and 52 of a signal insert wafer.

In FIG. 7 and FIG. 8, the first signal terminals 261A and 261B are fixed into the planar left-side spacer body 63 such that they each have a horizontal portion 34 that extends to a vertical portion 38. Both terminals 261A and 261B are substantially co-planar, meaning that they lie in a first plane and are adjacent to each other. The vertical portions 38 of each terminal 261A and 261B run to an offset section or segment 42, which in the left side body 63 extends the terminals 261A and 261B upwardly from the plane in which they both lie, to a second plane that is parallel to but elevated from first plane in which the terminals 261A and 261B both lie. Both offsets 42 continue downwardly past the bottom edge 47 of the left side body 63 at where they become the compliant pin tail portions 44 of the terminal set.

In the right half 52 of the signal insert wafer 24, there are terminals identical to terminals 261A and 261B except that in the right signal wafer half 52, they lie in a third plane, which is parallel to and displaced or offset from the first plane in which terminals 261A and 261B lie and the second plane in which the pin tails lie. There are offsets in the right half, which are not shown, that extend the terminals in the third plane to the aforementioned second plane such that the pin tails 44 that extend from the bottom edge 47 of the right half 52 will be co-planar with the pin tails 44 that extend from the left half 50 when the two halves are assembled together. The halves 50, 52 of the signal insert wafer may be assembled together with posts and holes as shown in FIG. 8 and they may be further connected such as a heat or ultrasonic welding.

In claim parlance, the signal terminals in the right side body 65 have a second offset that extends the terminals away from the third plane in a second direction to the aforementioned second plane from which they extend downwardly past the bottom edge of the wafer insert body. The extensions of the left side terminals and right side terminals are laterally displaced from each other, i.e, they are spaced apart from each other as shown in FIG. 9A.

Figure 9B:
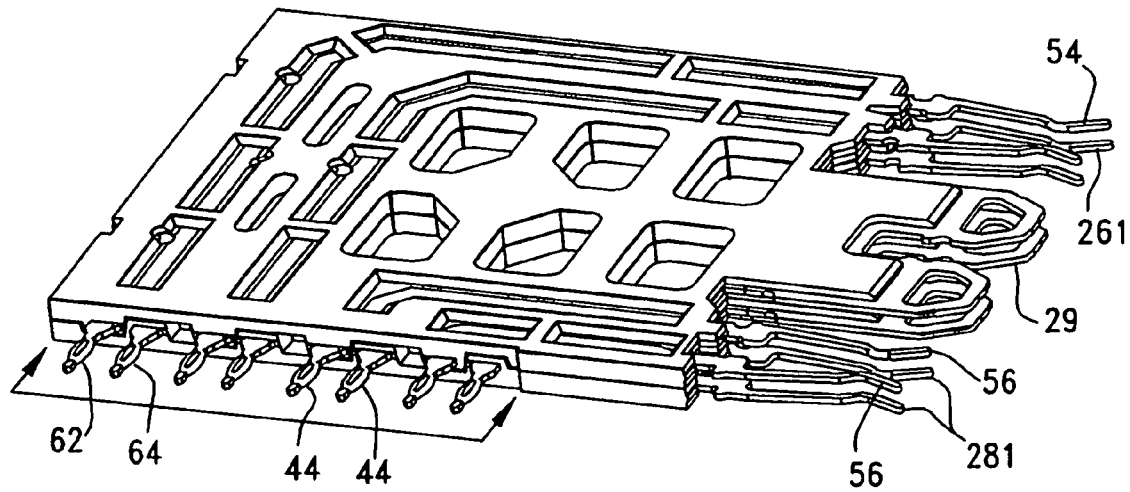
FIG. 9B is the same view as FIG. 9A but taken along the bottom of the signal terminal insert wafer to illustrate the alignment of the signal terminal tails along the bottom edges of the signal terminal insert wafer.

FIG. 9B is the same view as FIG. 9A but taken along the bottom of the signal terminal insert wafer 26 to illustrate the edge-to-edge alignment of the signal terminal tails 44 along the bottom edge 47 of the signal terminal insert wafer 24 halves 50 and 52. FIG. 10A is a perspective view of the signal terminal insert wafer 26 of FIG. 9 flanked by two ground terminal insert wafers 24. As stated above, the ground terminal insert wafers 24 provide isolation for the signal insert wafers 26. FIG. 10B is a perspective of all of the three insert wafers 24 and 26 assembled together to form a single signal transmission unit 70. As can be seen in the figure, the compliant pin tails 45 of the ground terminal insert wafer are co-planar and therefore lie alone the same line. Similarly for the compliant pin tails 44 of the signal insert wafer 25, they are co-planar when they exit the bottom edge and lie along the same line.

FIG. 10C is a bottom plan view of the single signal transmission unit 70. As can be seen in this figure, each signal terminal 44 forms the apex of a triangle, the other corners of which are two ground terminals 45. Signal "leakage" from any one of the signal pin tails 44 is minimized because of the relatively close proximity of ground terminals 45 to which signals from the signal pin tails are capacitively shunted. Additionally, each differential signal pair "DSP" lies within a geometric figure that is formed by interconnecting the four ground terminals 45 by imaginary lines. This is illustrated in the inset to the right of FIG. 10C. The geometric figure in the embodiments shown approximate a square or a rectangle and other figures may be used in their place, preferably four-sided figures. FIG. 10C also explains the order of the terminals relative to the differential signal contact portions shown in FIG. 9A. As shown, the tail portions are fully transitioned from the side-by-side arrangement in the contact portions thereof, where broadside capacitive coupling occurs, to and edge-to-edge arrangement in the tail portions where the terminals are connected to a circuit board.

Figure 15:
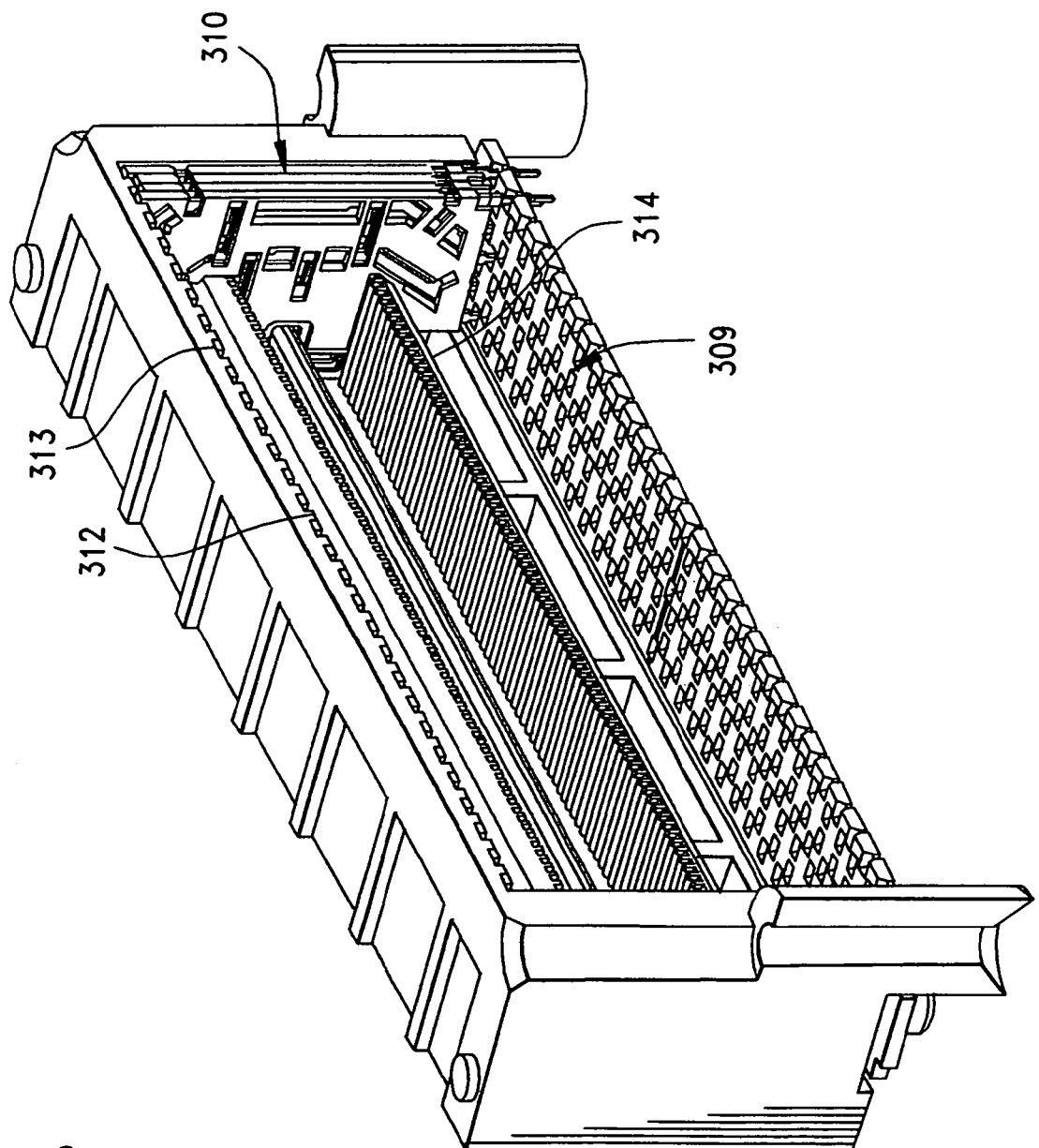
FIG. 15 is a view of the connector of FIG. 14, taken from the rear.

FIGS. 14-19 show an alternate embodiment of the a connector 300 constructed in accordance with principles of the present invention, which utilizes a housing 302 with only one receptacle slot 304. The housing 302 has a plurality of walls and the receptacle slot 304 is defined in the front wall 306. Posts 307 that receive mounting screws are show sectioned in this embodiment which are used to mount the connector 300 to a circuit board 13. As shown in FIG. 15, the rear of the connector 300 includes a hollow cavity 309 that accommodates terminal inserts 310. Similar to the embodiments explained above, the cavity 309 has a series of slots 312, 313 of different heights, with the slot 312 really being a land as previously described. The difference in heights of the slots 312, 313 matches the difference in height of the signal and ground insert wafers. The cavity also includes a retention rib 314 which the terminal insert wafers engage with retention clips.

Figure 16:
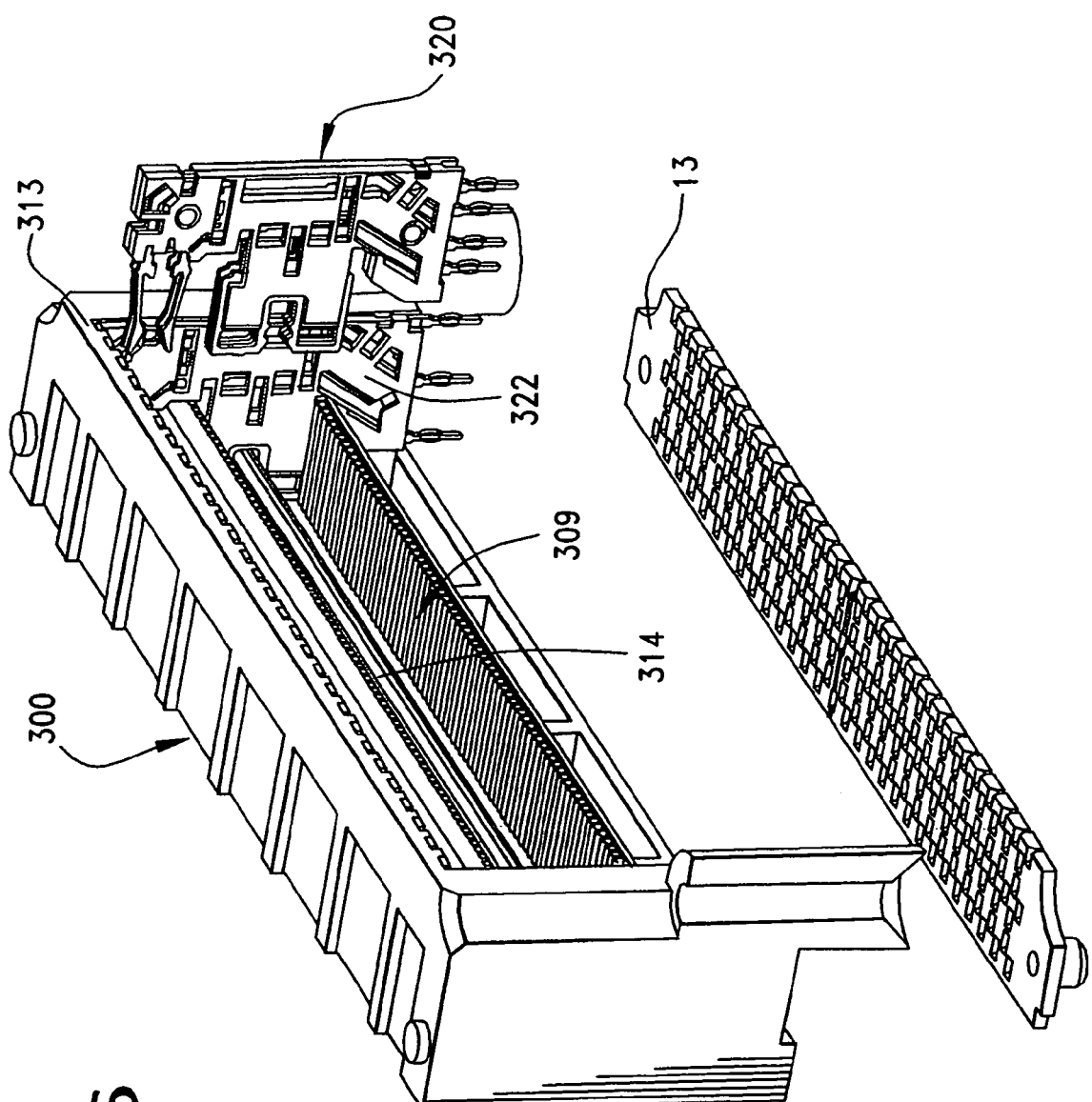
FIG. 16 is the same view as FIG. 15, but with the connector and its terminal assemblies removed from the circuit board and with a signal terminal assembly sown partially removed from the connector for clarity.
Figure 17:
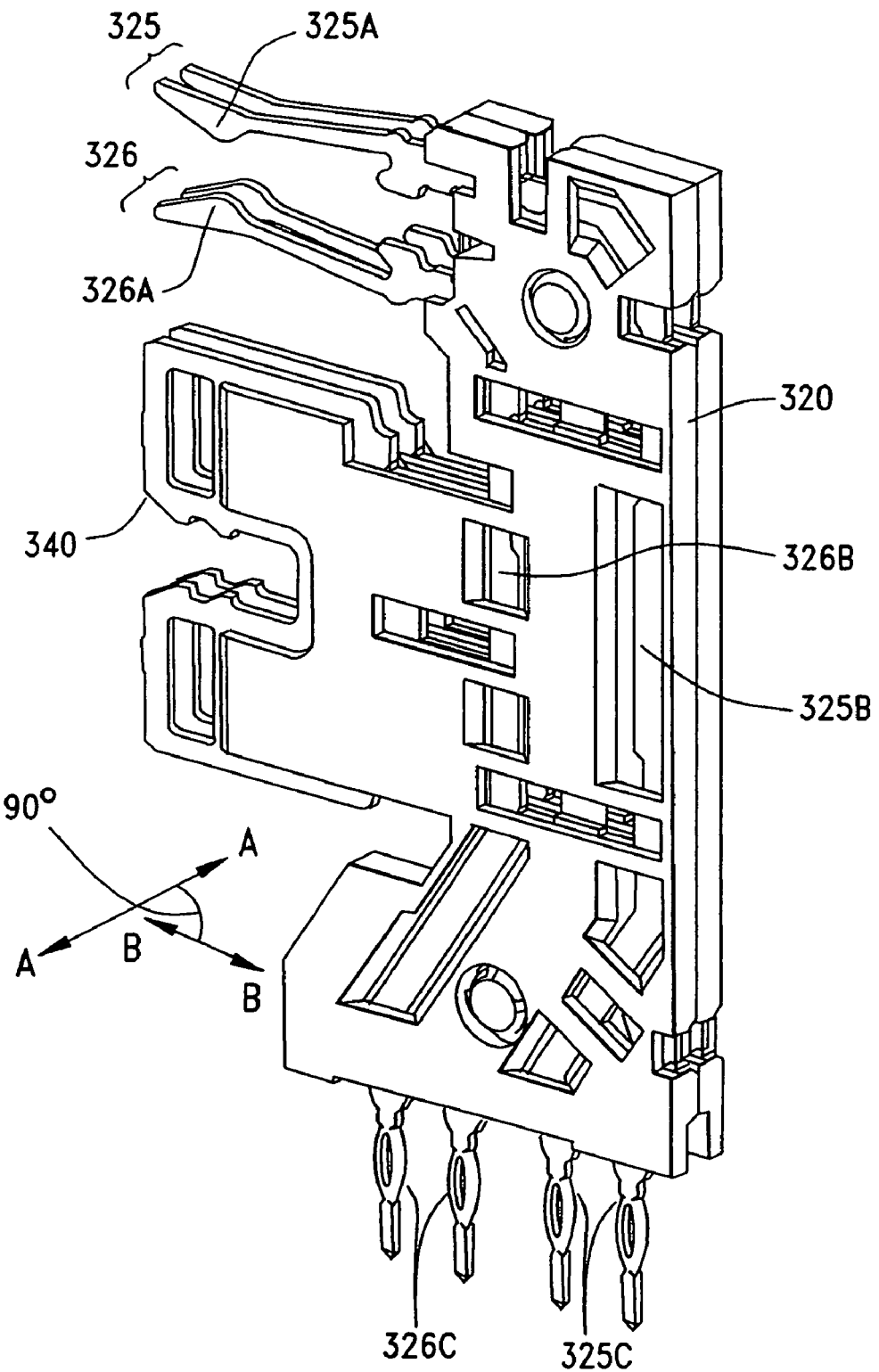
FIG. 17 is a perspective view of a signal terminal assembly used in the connector of FIG. 14.

FIG. 16 illustrates the connector 300 with one of the signal terminal insert wafers 320 partially removed from the cavity 309, and the ground terminal insert wafer 322 left in place in the cavity. FIG. 17 illustrates the signal terminal insert wafer 320 as removed from the connector 300. It can be seen that it includes two pairs of terminals 325, 326 which are aligned with each other broadside, or widthwise, as shown in the other embodiments and with respect to the connector receptacle slot 304. These terminal pairs have contact portions 325A, 326A, body portions 325B, 326B and tail portions 325C, 326C. The tail portions 325C and 326C are aligned lengthwise, or edge-to-edge with respect to each other. Whereas the contact portions 325A, 3256A are aligned horizontally along a line of action A-A shown in FIG. 17, the tails portions 325C, 326C are aligned along a lengthwise line of action B-B as shown in FIG. 17, which is offset from line of action A-A, and preferably at an angle of 90 degrees thereto, hence the reason why we refer to the tail portions being 90 degrees offset from the contact portions.

Figure 19:
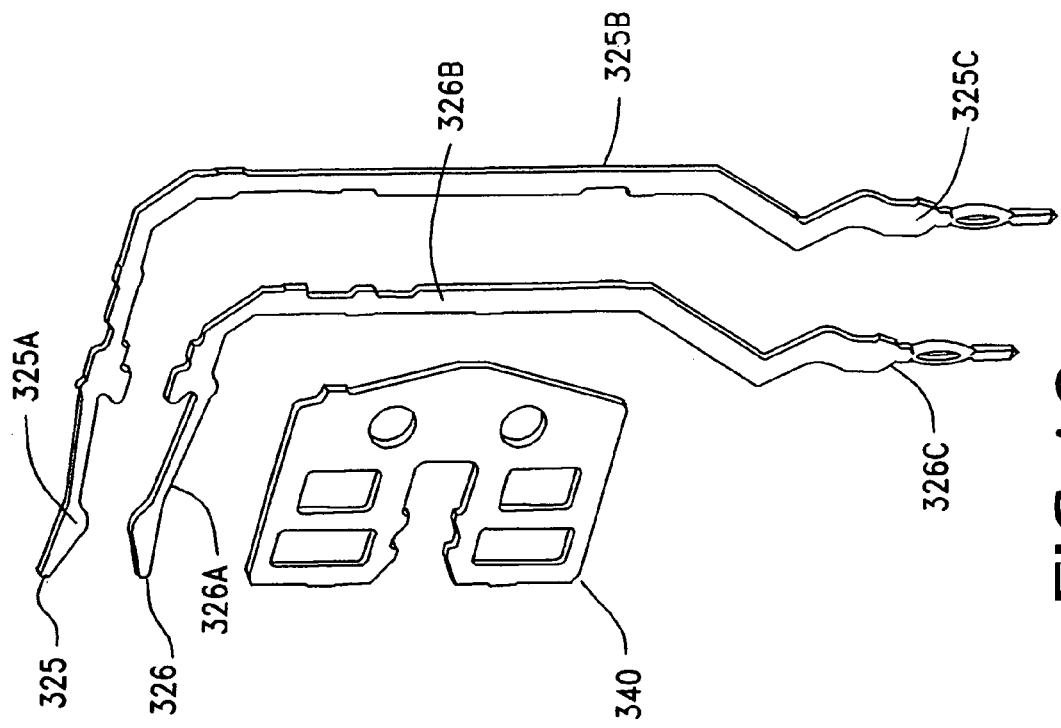
Figure 18:
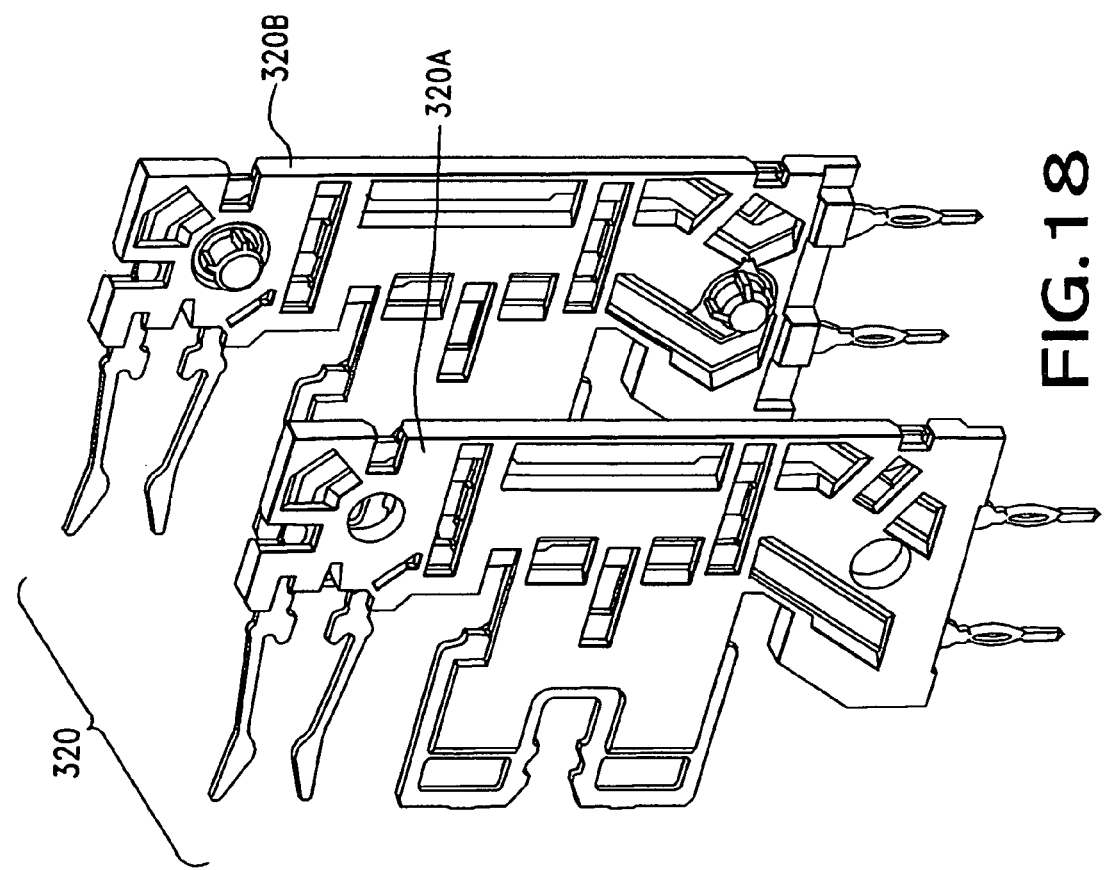
FIG. 18 is the same view as FIG. 17, but with the signal terminal assembly halves removed for clarity; and, FIG. 19 is a view of the terminal used in one of the signal terminal assembly halves of FIG. 17.

As shown in FIG. 18, the signal terminal insert wafer 320 is formed from two engaging halves 320A and 320B. FIG. 19 illustrates one set of the terminals that make of the terminal pairs in FIG. 17.

Figure 11:
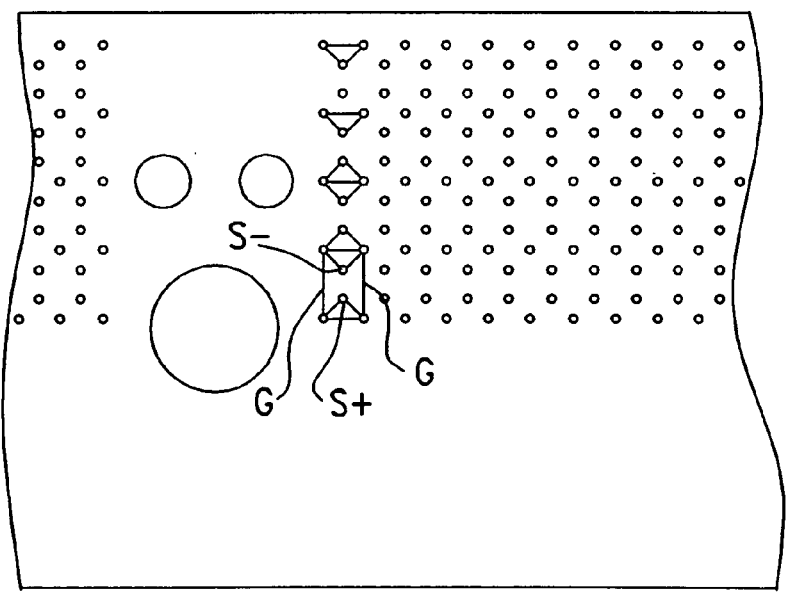
FIG. 11 is a top plan view of a circuit board layout used in conjunction with the connectors of FIG. 1.

FIG. 11 is a top plan view of a circuit board layout used in conjunction with the connectors of FIG. 1. As can be seen in FIG. 11, each through hole for a signal pin is closely bounded by at least two ground leads or through holes that are intended to receive ground pins therein. That the closest pins to a signal lead are ground pins tends to shunt signals from a signal pin to ground potential thus reducing the likelihood that a signal on one set of differential pairs will be coupled to another differential signal pair. This circuit board arrangement minimizes cross talk between differential signal pairs in that at the circuit board level, there are four ground terminals extending into the circuit board that encompass each differential signal pair. Additionally, the ground terminals of the connectors of the invention are commoned together near the circuit board level and this commoning bar also provide a short path from a differential signal terminal to the nearest reference ground terminal set. Each differential signal tail portion hole is at the apex of an imaginary triangle in which the other two apices are formed by intersecting lines drawn through the two closest ground terminal tail portion holes. This arrangement is shown to the left of FIG. 11, where "S+" represents a positive differential signal through hole of a signal pair and "S−" represents a negative differential signal through hole of that signal pair and "G" represents ground signal through holes of the circuit board.

Figure 12:
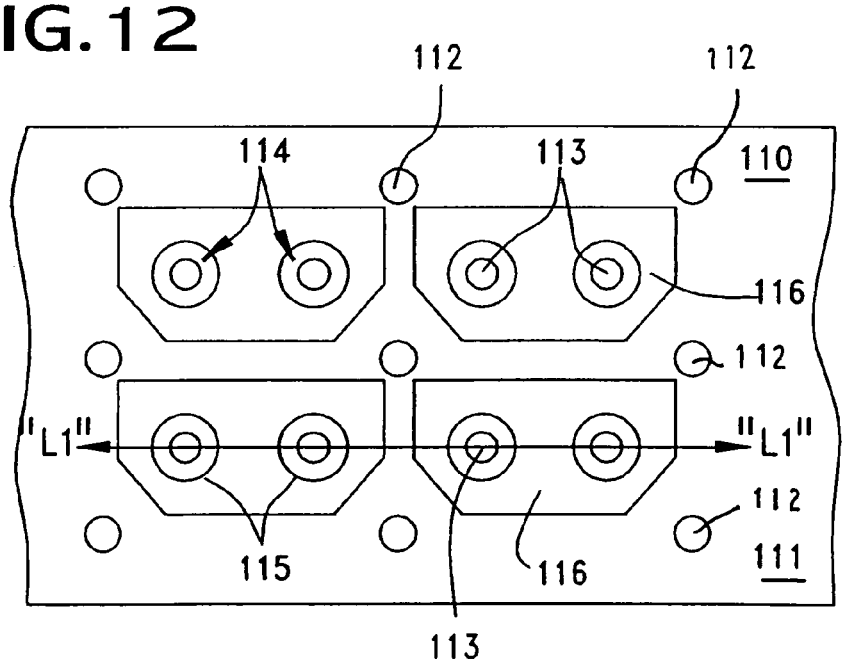
FIG. 12 is an enlarged detail view of a portion of FIG. 11, illustrating the use of an anti-pad style opening in a ground plane layer of the circuit board of FIG. 11.

FIG. 12 is an enlarged detail view of a portion of FIG. 11, illustrating the use of an anti-pad style opening in a ground plane layer of the circuit board 110 of FIG. 11. This is a top plane view and it illustrates signal through holes, or vias 113 and ground through holes, or vias 112. The signal vias are arranged in line with each other along an axis L1. Two of the signal vias 113 are closely spaced to each other to form a pair of differential signal vias 114 and so accommodate the tail portions of the signal terminal insert wafer. The remaining vias 112 are connected tot he ground plane 111 and these vias are also arranged in rows that flank the signal via pairs. An anti-pad 116, may be included and this "anti-pad" refers to an area in which the conductive material that forms the ground plane 11 has been removed. Remaining in these open areas are annular conductive rings 1115. The openings shown in FIG. 12 are five-sided and take a polygonal shape, and are oriented as illustrated so that one line of ground vias (that shown above the top row of signal vias in FIG. 12) is proximate to the sharp corners (90 degrees) of the openings 116, while the other and opposite line of ground vias, those shown below the top row of signal vias in FIG. 12 are spaced further away from the angled edges of the openings 116. If the anti-pad structure of the circuit board were square, rather than a pentagon, the ground vias would be located proximate the corners of the anti-pad. These ground vias may be considered as defining an imaginary four-sided figure, the perimeter of which encloses the anti-pad structures.

Figure 13:
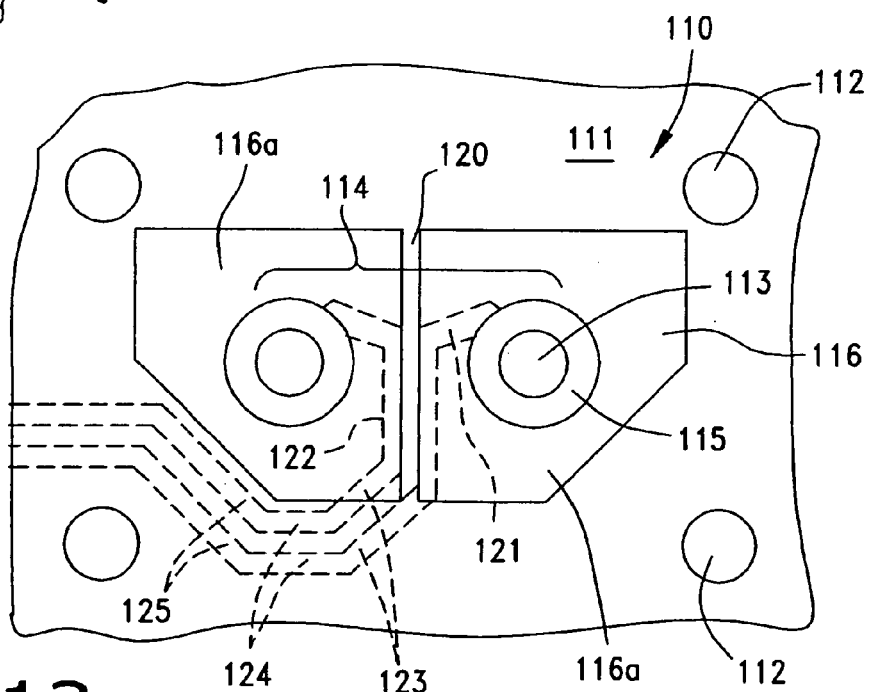
FIG. 13 is an enlarged detail view of a portion of the circuit board of FIG. 11, illustrating another ground plane layer and signal trace route out construction suitable for use with connectors of the present invention.

FIG. 13 is an enlarged detail view of a portion of the circuit board of FIG. 11, illustrating another ground plane layer and signal trace route out construction suitable for use with connectors of the present invention. In this arrangement, the pentagon-like opening 116 has been spilt into two openings, 116a, each of which encompasses a single signal via 113 of a pair 114 of differential signal vias 113. The two openings 116a are spilt by a thin extension strip 120 of the ground plane that cuts across, and preferably bisects, the opening 116 into two substantially equal openings 116a.

The circuit traces that exit the signal vias 113 are shown in phantom in FIG. 13. They include flag portions or the like 121 that extend toward each other from the vias 113. Those flag portions are joined to first strip portions 122 that run in a circuit board layer underneath (or above) the ground plane layer 111. These first portions, as shown, extend beneath the center bisecting trip 120 and they are preferably aligned with the strip 120 so that the outer edges of the first portions 122 align themselves with the outer edges of the strip 120 (or the inner edges of the two openings 116a on opposite sides of the strip 120. Second conductive portions 123 are shown joined to the first portions 122 and are shown extending at an angle thereto. Third and fourth portions 124, 125 are also joined to the second and third portions, respectively, at angles so that the circuit traces tend to follow the outer configuration of the opening 116a on the left of the strip 120 in FIG. 13. This is to give these circuit traces a ground plane or strip of particular configuration to couple with.

While the preferred embodiments of the invention have been shown and described, it will be appreciated by those skilled in the art that changes and modifications may be made to these embodiments without departing from the spirit of the invention, the scope of which is defined by the appended claims.

The invention claimed is:

1. A differential signal terminal insert for insertion into a connector, comprising:

a first insert half having a front edge and an opposing rear edge and opposing top and bottom edges, and a first signal terminal fixed in the first insert half having a horizontal portion extending from a first point beyond the front edge of the first insert half to a second point in the first insert half between said front edge and the rear edge, a vertical portion extending from the second point to a third point in the first insert half above the bottom edge, said horizontal and vertical portions lying in a first plane, said first signal terminal having a first offset portion that extends from the third point in said first insert half away from the first plane in a first direction to a second plane spaced from said first plane, said first offset portion extending downwardly past the bottom edge of said first insert half in said second plane; and, a second insert half that mates to said first insert half, the second insert half including having a front edge and an opposing rear edge and having opposing top and bottom edges, and a second signal terminal fixed in the second insert half and having a horizontal portion extending from a first point beyond the front edge of said second insert half to a second point in said second insert half between said front edge and the rear edge of said second insert half, a vertical portion extending from the second point to a third point in said second insert half above the bottom edge of said second insert half, said horizontal and vertical portions lying in a second plane parallel to and displaced from the first plane, said second signal terminal having a second offset portion that extends from the third point in said second insert half away from the second plane in a second direction to the second plane, said second offset portion extending downwardly past the bottom edge of said second insert half in said second plane but laterally displaced from and the first offset portion.

2. The differential signal terminal insert of claim 1, wherein said first second offset portions that extend past the bottom edge of the first and second insert halves are compliant pin tails.

3. The differential signal terminal insert of claim 1, wherein said first and second signal terminals include planar conductive strips which extend between the first and third points in both said first and second insert halves, the strips facing each other.

4. The differential signal terminal insert of claim 1 wherein the first and second signal terminals include planar conductive strips between the third point and the bottom edge of each insert half which lie alongside each other.

5. The differential signal terminal insert of claim 1, wherein said first and said second terminals are at least partially held within said first and second insert halves between said front and bottom edges thereof, said first and second insert halves further including a plurality of slots disposed therein that expose portions of said signal terminas to air.

6. The differential signal terminal insert of claim 1, wherein said first and said second terminals each include contact portions at free ends of said horizontal portions, the first and second terminal contact portions being aligned with each other broadside along said front edge, and said first and second terminal further include tail portions at free ends of said vertical portions, the first and second terminal tail portions being aligned edge to edge along said bottom edges of said first and second insert halves.

7. A terminal assembly for a connector for use in transmitting differential signals the terminal assembly comprising:

first, second and third insulative bodies, each of the insulative bodies including a mating edge and a mounting edge angularly offset from the mating edge, the first insulative body supporting at least one conductive terminal, the terminals being arranged into at least one pair of differential signal terminals and a pair of ground terminals;

the second and third insulative bodies being disposed on opposite sides of said first insulative body, said first insulative body supporting the pair of differential signal terminals and said second insulative body supporting at least one ground terminal and said third insulative body supporting at least another ground terminal;

said terminals all including contact portions that extend along the mating edge of said insulative bodies and tail portions that extend along the mounting edge of said insulative bodies and body portions that interconnect the contact and terminal portions together, the pair of differential signal terminals being arranged at their contact portions side-by-side in said first insulative body in order to effect broadside capacitive coupling between said contact portions of said pair of differential signal terminals, the pair of differential signal terminals further converging toward each other widthwise within said first insulative body so as to be arranged at their tail portions edge-to-edge along a common axis of said first insulative body from front to back of said mounting edge in order to effect edge coupling between said tail portions of said differential signal terminals pair.

8. The connector terminal assembly of claim 7, wherein said first insulative body includes first and second halves.

9. The connector terminal assembly of claim 8, wherein said first insulative body first and second halves interengage each other.

10. The connector terminal assembly of claim 8, wherein each of said first insulative body first and second halves includes a plurality of teeth and notches in alternating fashion along said first insulative body mounting edge, the teeth and notches being further arranged to interfit with each other such that the teeth of said first half are received within the notches of said second half, and the teeth of said second wafer half are received within the notches of said first half.

* * * * *